US010643692B2

(12) United States Patent
Yang et al.

(10) Patent No.: US 10,643,692 B2
(45) Date of Patent: May 5, 2020

(54) ADAPTIVE PROGRAMMING VOLTAGE FOR NON-VOLATILE MEMORY DEVICES

(71) Applicant: SanDIsk Technologies LLC, Plano, TX (US)

(72) Inventors: Xiang Yang, San Jose, CA (US); Huai-Yuan Tseng, San Jose, CA (US); Deepanshu Dutta, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 117 days.

(21) Appl. No.: 15/910,998

(22) Filed: Mar. 2, 2018

(65) Prior Publication Data

US 2019/0272871 A1 Sep. 5, 2019

(51) Int. Cl.
*G11C 11/56* (2006.01)
*G11C 16/04* (2006.01)
*G11C 16/34* (2006.01)
*G11C 16/10* (2006.01)

(52) U.S. Cl.
CPC ...... *G11C 11/5628* (2013.01); *G11C 11/5642* (2013.01); *G11C 16/0483* (2013.01); *G11C 16/10* (2013.01); *G11C 16/3418* (2013.01); *G11C 2211/5621* (2013.01)

(58) Field of Classification Search
CPC ............................ G11C 11/5628; G11C 16/12
See application file for complete search history.

(56) References Cited

U.S. PATENT DOCUMENTS

| 7,564,715 | B2 | 7/2009 | Mokhlesi | |
|---|---|---|---|---|
| 8,780,627 | B1* | 7/2014 | Yang | G11C 11/5628 |
| | | | | 365/185.03 |
| 8,891,303 | B1* | 11/2014 | Higgins | G11C 16/10 |
| | | | | 365/185.1 |
| 9,214,240 | B2 | 12/2015 | Dutta et al. | |
| 2006/0136858 | A1* | 6/2006 | Erickson | G11C 17/18 |
| | | | | 716/116 |
| 2007/0253248 | A1 | 11/2007 | Maayan et al. | |
| 2007/0253256 | A1* | 11/2007 | Aritome | G11C 11/5628 |
| | | | | 365/185.24 |

(Continued)

OTHER PUBLICATIONS

International Search Report and Written Opinion dated Mar. 27, 2019 for corresponding International Application No. PCT/US2018/064802.

*Primary Examiner* — Huan Hoang
*Assistant Examiner* — Jay W. Radke
(74) *Attorney, Agent, or Firm* — Vierra Magen Marcus LLP

(57) ABSTRACT

Apparatuses, systems, and methods are disclosed for adjusting a programming setting such as a programming voltage of a set of non-volatile storage cells, such as an SLC NAND array. The non-volatile storage cells may be arranged into a plurality of word lines. A subset of the non-volatile storage cells may be configured to store a programming setting. An on-die controller may be configured to read the programming setting from the setting subset, and write data to the non-volatile storage cells, using the programming setting. The on-die controller may further be configured to determine that the programming setting causes suboptimal programming of one or more of the non-volatile storage cells, and in response to the determination, store a revised programming setting on the setting subset.

23 Claims, 17 Drawing Sheets

(56) References Cited

U.S. PATENT DOCUMENTS

| | | | |
|---|---|---|---|
| 2008/0253193 A1 | 10/2008 | Cernea | |
| 2009/0122615 A1* | 5/2009 | Jang | G11C 16/349 365/185.18 |
| 2009/0154237 A1* | 6/2009 | Tokiwa | G11C 7/1078 365/185.03 |
| 2009/0268516 A1* | 10/2009 | Murin | G11C 11/5628 365/185.03 |
| 2010/0165740 A1 | 7/2010 | Nagashima et al. | |
| 2012/0033492 A1 | 2/2012 | Chen | |
| 2012/0239858 A1* | 9/2012 | Melik-Martirosian | G11C 16/349 711/103 |

* cited by examiner

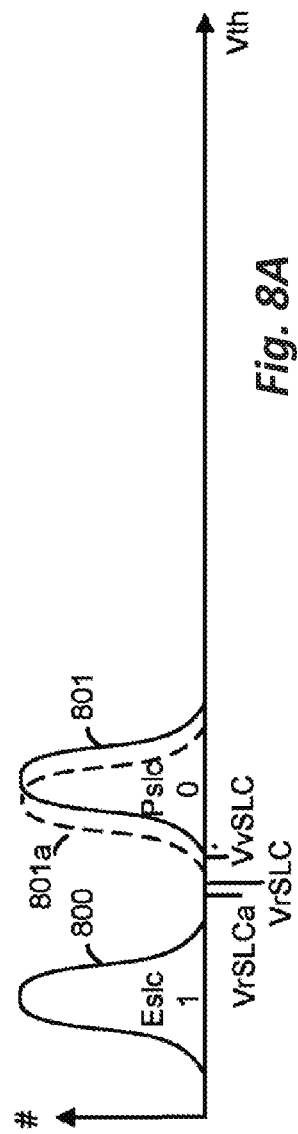
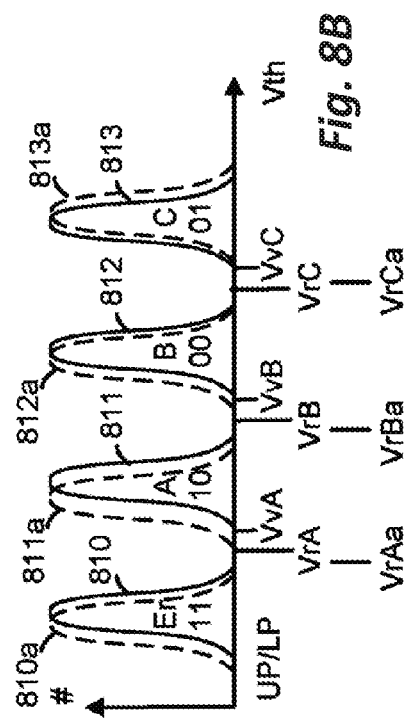

ADAPTIVE PROGRAMMING VOLTAGE FOR NON-VOLATILE MEMORY DEVICES

CROSS-REFERENCE TO RELATED APPLICATIONS

The present application is related to U.S. application Ser. No. 12/111,729, filed Apr. 28, 2008 and entitled METHOD FOR ADAPTIVE SETTING OF STATE VOLTAGE LEVELS IN NON-VOLATILE MEMORY, now issued as U.S. Pat. No. 7,808,819, the disclosure of which is incorporated by reference as though set forth herein in its entirety.

The present application is also related to U.S. application Ser. No. 14/882,858, filed Oct. 14, 2015 and entitled WORD LINE DEPENDENT PROGRAMMING IN A MEMORY DEVICE, now issued as U.S. Pat. No. 9,548,124, the disclosure of which is incorporated by reference as though set forth herein in its entirety.

The present application is also related to U.S. application Ser. No. 15/131,392, filed Apr. 18, 2016 and entitled DUMMY VOLTAGE TO REDUCE FIRST READ EFFECT IN MEMORY, the disclosure of which is incorporated by reference as though set forth herein in its entirety.

The present application is also related to U.S. application Ser. No. 10/818,597, filed Apr. 6, 2004 and entitled VARIABLE PROGRAMMING OF NON-VOLATILE MEMORY, now issued as U.S. Pat. No. 7,0200,017, the disclosure of which is incorporated by reference as though set forth herein in its entirety.

TECHNICAL FIELD

The present disclosure, in various embodiments, relates to storage devices, and more particularly, to systems and methods for adaptively changing the programming voltage of a non-volatile storage device.

BACKGROUND

Many data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

Nonvolatile memory types include, but are not limited to, ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), spin-transfer torque (STT) MRAM, spin orbit torque SOT-MRAM, magnetic storage media (e.g., hard disk, tape), optical storage media, and the like. Among non-volatile memory types used to encode information in retained charges, various charging and/or charge retention technologies may be used, including but not limited to floating gate and charge trapping technologies. In many of the foregoing technologies, the memory types can experience changes in the threshold voltage (Vth) above which the cell is read as being programmed. The result of such threshold voltage shift, if no corrective action is taken, may be read errors in cells.

SUMMARY

Apparatuses and methods are presented for adapting programming settings of one or more non-volatile memory elements. In one embodiment, a memory die may include a set of non-volatile storage cells arranged into a plurality of rows associated with a plurality of word lines, wherein a subset of the cells is configured to store a programming setting. The memory die may further include an on-die controller configured to read the programming setting from the subset of the cells, write data to the non-volatile storage cells, using the programming setting, determine that the programming setting causes suboptimal programming of data to the non-volatile storage cells, and, in response to determining that the programming setting causes suboptimal programming of data to the non-volatile storage cells, store a revised programming setting in non-volatile storage cells of the subset.

The programming setting may indicate a first programming voltage. The on-die controller may further be configured to write the data to the non-volatile storage cells by transmitting a single pulse at the first programming voltage through the non-volatile storage cells. The revised programming setting may indicate a second programming voltage lower than the first programming voltage.

The on-die controller may further be configured to store the revised programming setting in non-volatile storage cells of the subset without first erasing the programming setting from the subset.

The plurality of word lines in the plurality of rows may include a dummy word line in a dummy row with two or more spare columns including the subset of the cells, and a plurality of data word lines, separate from the dummy word line. The plurality of data word lines may be configured to store the data.

The subset of the cells may be positioned proximate a driver of the dummy word line.

The non-volatile storage cells may be arranged into a plurality of blocks including a first block including the plurality of word lines and a second block including a second plurality of word lines. The on-die controller may further be configured to read a second programming setting from a second subset of the second plurality of word lines, write data to the non-volatile storage cells of the second plurality of word lines, using the second programming setting, determine that the second programming setting causes suboptimal programming of one or more of the non-volatile storage cells of the second plurality of word lines, and, in response to determining that the second programming setting causes suboptimal programming of one or more of the non-volatile storage cells of the second plurality of word lines, store a revised second programming setting on the second subset.

The on-die controller may further be configured to determine a number of cells with a threshold voltage within a predetermined range, and determine whether the number of cells with the threshold voltage within the predetermined range satisfies one or more criteria.

The on-die controller may further be configured to determine that the programming setting causes suboptimal programming of data to the non-volatile storage cells in response to a trigger that is configured to activate after a random number of programming operations are performed on one or more of the word lines.

In one embodiment, an apparatus may include a set of non-volatile storage cells connected to word lines and bit lines. The word lines may include a dummy word line configured to store a programming voltage flag, and a plurality of data word lines. The apparatus may further include an on-die controller with a storage circuit configured to use a first programming voltage associated with the programming voltage flag to store user data in non-volatile storage cells of the word lines and erase the user data from non-volatile storage cells of the data word lines, a determination circuit configured to determine that the first programming voltage causes over-programming of the non-volatile storage cells, a setting selection circuit configured to, in response to determination that the first programming voltage causes over-programming of the non-volatile storage cells, select a second programming voltage different from the first programming voltage, and an update circuit configured to store a revised programming voltage flag associated with the second programming voltage in the dummy word line by overwriting at least part of the programming voltage flag with the revised programming voltage flag.

The storage circuit may further be configured to store the user data by transmitting a single pulse at the first programming voltage to the non-volatile storage cells. The second programming voltage may be lower than the first programming voltage.

The determination circuit may further be configured to determine that the first programming voltage causes over-programming of the non-volatile storage cells by determining that the single pulse causes over-programming of one or more of the non-volatile storage cells.

The on-die controller may further include a random number generator configured to generate a random number, and an evaluation circuit configured to determine that the random number meets one or more criteria. The determination circuit may further be configured to determine that the single pulse causes over-programming of one or more of the non-volatile storage cells in response to determination, by the evaluation circuit, that the random number meets the one or more criteria.

The dummy word line may further be configured to store the programming voltage flag in a spare column of the dummy word line, proximate a decoder of the dummy word line.

The dummy word line may include a byte that stores the programming voltage flag with one or more bits set to an erased state. The storage circuit may further be configured to store the revised programming voltage flag by changing the one or more bits to a programmed state without changing any bit of the byte to an erased state.

According to one embodiment, a system may include an SLC NAND array with a set of non-volatile storage cells, and an on-die controller that shares a die with the SLC NAND array. The on-die controller may be configured to read a programming voltage setting from the SLC NAND array, and initiate a single pulse to write data on the SLC NAND array at the programming voltage setting.

The on-die controller may further be configured to store an updated programming voltage setting on the SLC NAND array.

The on-die controller may further be configured to determine that writing the data at the programming voltage setting causes over-programming of one or more of the non-volatile storage cells, and initiate storage of the updated programming voltage setting in response to determining that writing the data at the programming voltage setting causes over-programming of one or more of the non-volatile storage cells.

The on-die controller may further be configured to store the updated programming voltage setting without erasing the programming voltage setting from the SLC NAND array.

According to one embodiment, a method may include reading a programming setting from a setting segment of non-volatile storage cells, writing data on a data segment of non-volatile storage cells using the programming setting, and, in response to a trigger, storing a revised programming setting on the setting segment.

The programming setting may indicate a first programming voltage. Writing the data on the data segment may include transmitting a single pulse at the programming voltage to the data segment. Storing the revised programming setting may include storing indication of a second programming voltage, lower than the first programming voltage, on the setting segment.

Storing the revised programming setting may include over-writing at least part of the programming setting to store the revised programming setting.

The method may further include providing the trigger by determining that the programming setting causes a threshold voltage of one or more of the non-volatile storage cells to exceed a predefined level.

Determining that the programming setting causes the threshold voltage to exceed the predefined level may include determining a number of cells with a threshold voltage within a predetermined range, and determining whether the number of cells with the threshold voltage within the predetermined range satisfies one or more criteria.

The method may further include providing the trigger by generating a random number, and detecting the trigger by determining that the random number meets one or more criteria.

According to one embodiment, an apparatus may include means for reading a programming setting on a spare column associated with a first word line of a plurality of word lines of a set of non-volatile storage cells, means for writing data to one or more of the plurality of word lines using the programming setting, means for determining that the programming setting causes a threshold voltage of one or more of the non-volatile storage cells to be excessive, and means for storing a revised programming setting on the spare column of the first word line in response to determining that the programming setting causes the threshold voltage to be excessive.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 8A depicts example Vth distributions of memory cells, where two data states are used, and a shift in Vth is observed.

FIG. 8B depicts example Vth distributions of memory cells, where four data states are used, and a shift in Vth is observed.

DETAILED DESCRIPTION

Figure 1A:
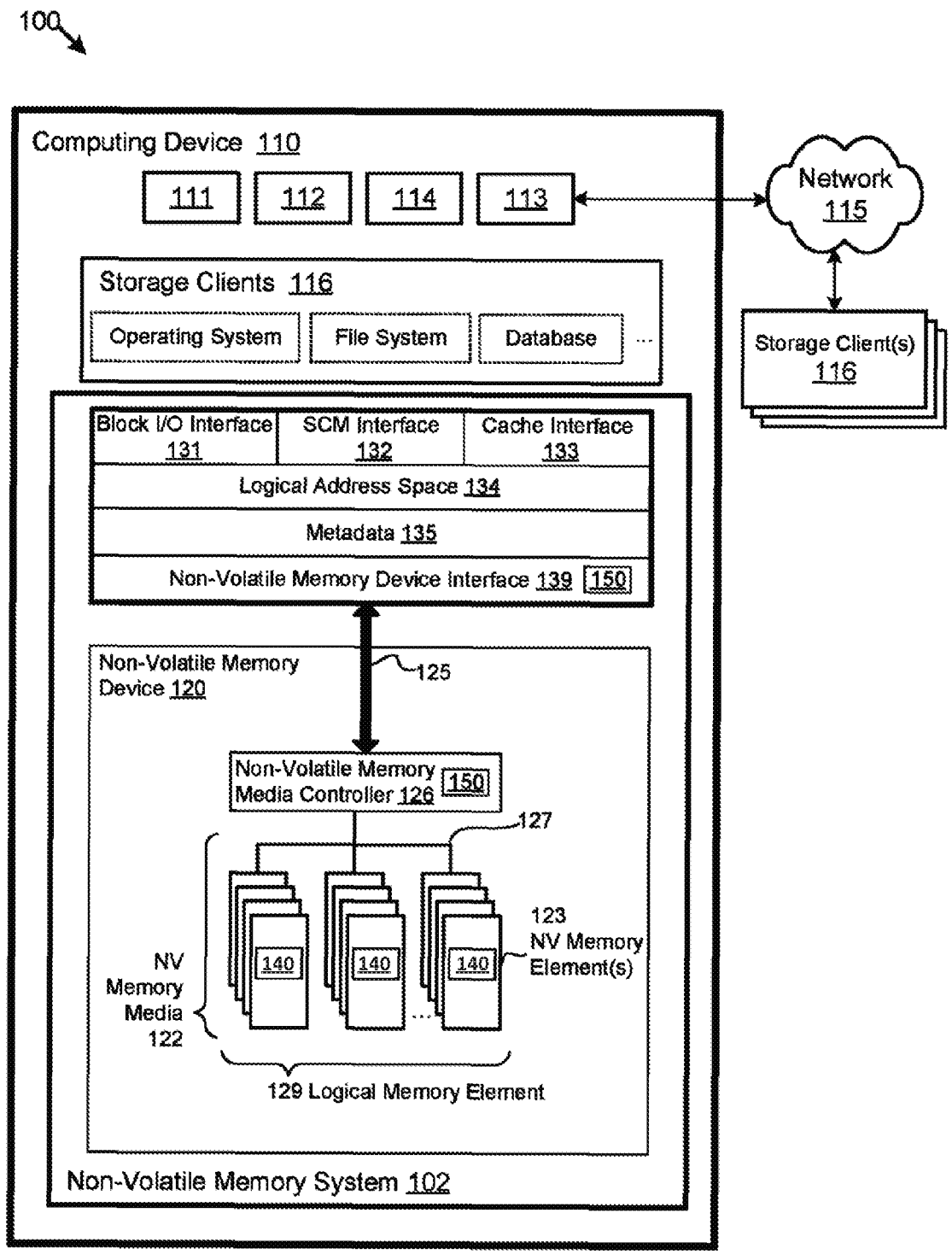
FIG. 1A is a block diagram of one embodiment of a system including a voltage adjustment component for a non-volatile memory device.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the hardware units described in this specification have been labeled as circuits, in order to more particularly emphasize their implementation independence. For example, a circuit may be a custom VLSI circuit or gate array, all or part of an off-the-shelf semiconductor such as a logic chips, transistor, or other discrete component. A circuit may also be implemented in programmable hardware devices such as field programmable gate arrays, programmable array logic, programmable logic devices, or the like. Notably, where multiple circuits are recited, they may, in some instances, share hardware elements; thus, two different circuits may be embodied as a single body of hardware that is configured, via software or distinct hardware elements, to perform the recited functions of the two circuits.

Modules may be implemented in circuits, and/or in software for execution by various types of processors. An identified module of executable code may, for instance, include one or more physical or logical blocks of computer instructions which may, for instance, be organized as an object, procedure, or function. Nevertheless, the executables of an identified module need not be physically located together, but may include disparate instructions stored in different locations which, when joined logically together, make up the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, is a tangible, physical, non-transitory device. For example, a component may be implemented as a hardware logic circuit with custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may include one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only, and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 with a setting adjustment component 150 for a non-volatile memory device 120. The setting adjustment component 150 may be part of and/or in communication with a non-volatile memory media controller 126, a non-volatile memory element 123, a device driver, or the like. The setting adjustment component 150 may operate on a non-volatile memory system 102 of a computing device 110, which may include a processor 111, volatile memory 112, and a network interface 113. The processor 111 may include one or more central processing units, one or more general-purpose processors, one or more application-specific processors, one or more virtual processors (e.g., the computing device 110 may be a virtual machine operating within a host), one or more processor cores, or the like. The network interface 113 may include one or more network interfaces configured to communicatively couple the computing device 110 and/or non-volatile memory media controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 includes one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may include one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the communications network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a communications network 115, such as an Ethernet network, an Infiniband network, SCSI RDMA over a communications network 115, a storage area network (SAN), a local area network (LAN), a wide area network (WAN) such as the Internet, another wired and/or wireless network, or the like.

The computing device 110 may further include a non-transitory, computer readable storage medium 114. The computer readable storage medium 114 may have executable instructions configured to cause the computing device 110 (e.g., processor 111) to perform steps of one or more of the methods disclosed herein. Alternatively, or in addition, the setting adjustment component 150 may be embodied as one or more computer readable instructions stored on the computer readable storage medium 114.

The non-volatile memory system 102, in the depicted embodiment, includes a setting adjustment component 150. The setting adjustment component 150, in one embodiment, is configured to adjust the programming voltage used to program cells of the non-volatile memory elements 123 to help avoid over-programming the non-volatile memory elements 123, as will be described below. The setting adjustment component 150, in certain embodiments, may perform a detect operation to determine whether some of the non-volatile memory elements 123 are beginning to be over-programmed by application of a programming setting, such as a programming voltage, stored in the non-volatile memory elements. If the non-volatile memory elements 123 are being over-programmed, the setting adjustment component 150 may store an updated programming setting, such as an updated programming voltage, in the non-volatile memory elements 123. Thus, over-programming may be avoided and the useful life of the non-volatile memory device 120 may be extended.

In one embodiment, the setting adjustment component 150 may include logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the setting adjustment component 150 may include executable software code, such as a device driver or the like, stored on the computer readable storage medium 114 for execution on the processor 111. In a further embodiment, the setting adjustment component 150 may include a combination of both executable software code and logic hardware.

In one embodiment, the setting adjustment component 150 is configured to receive storage requests from a device driver or other executable application via a bus 125 or the like. The setting adjustment component 150 may be further configured to transfer data to/from a device driver and/or storage clients 116 via the bus 125. Accordingly, the setting adjustment component 150, in some embodiments, may include and/or be in communication with one or more direct memory access (DMA) modules, remote DMA modules, bus controllers, bridges, buffers, and so on to facilitate the transfer of storage requests and associated data. In another embodiment, the setting adjustment component 150 may receive storage requests as an API call from a storage client 116, as an IO-CTL command, or the like.

According to various embodiments, a non-volatile memory media controller 126 in communication with one or more program sequencing components 140 may manage one or more non-volatile memory devices 120 and/or non-volatile memory elements 123. The non-volatile memory device(s) 120 may include recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may include a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients operating on the computing device 110 and/or remote, storage clients 116 accessible via the communications network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may include one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may include a plurality of logical addresses, each corresponding to respective media locations of the one or more non-volatile memory devices 120. A device driver may maintain metadata 135 including any-to-any mappings between logical addresses and media locations, or the like.

A device driver may further include and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a communications network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The network interface 113 may include one or more network interfaces configured to communicatively couple the computing device 110 and/or the non-volatile memory media controller 126 to a communications network 115 and/or to one or more remote, network-accessible storage clients 116. The storage clients 116 may include local storage clients operating on the computing device 110 and/or remote, storage clients 116 accessible via the communications network 115 and/or the network interface 113. The non-volatile memory media controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may include one or more non-volatile memory elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), spin-transfer torque (STT) MRAM, spin orbit torque SOT-MRAM, magnetic storage media (e.g., hard disk, tape), optical storage media, and/or the like. The one or more non-volatile memory elements 123 of non-volatile memory media 122, in certain embodiments, include storage class memory (SCM). Examples herein refer to NAND memory, or more particularly, SLC NAND memory; however, the systems and methods provided herein may be applied to other memory types, including but not limited to those listed above.

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may include one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, MANOS memory, PMC memory, CBRAM, MRAM, and/or variations thereof.

While the non-volatile memory media 122 is referred to herein as "memory media," in various embodiments, the non-volatile memory media 122 may more generally include one or more non-volatile recording media capable of recording data, which may be referred to as a non-volatile memory medium, a non-volatile storage medium, or the like. Further, the non-volatile memory device 120, in various embodiments, may include a non-volatile recording device, a non-volatile memory device, a non-volatile storage device, or the like.

The non-volatile memory media 122 may include one or more non-volatile memory elements 123, which may include, but are not limited to: chips, packages, planes, die, or the like. A non-volatile memory media controller 126 may be configured to manage data operations on the non-volatile memory media 122, and may include one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may include an I/O bus for communicating data to/from the non-volatile memory elements 123. The bus 127 may further include a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory media controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory media controller 126 may include and/or be in communication with a device driver executing on the computing device 110. A device driver may provide storage services to the storage clients 116 via one or more interfaces 131, 132, and/or 133. In some embodiments, a device driver provides a block I/O interface 131, or device interface, through which storage clients 116 perform block-level I/O operations. Alternatively, or in addition, a device driver may provide a storage class memory (SCM) interface 132, which may provide other storage services to the storage clients 116. In some embodiments, the SCM interface 132 may include extensions to the block I/O interface 131 (e.g., storage clients 116 may access the SCM interface 132 through extensions or additions to the block I/O interface 131). Alternatively, or in addition, the SCM interface 132 may be provided as a separate API, service, and/or library. A device driver may be further configured to provide a cache interface 133 for caching data using the non-volatile memory system 102.

A device driver may further include a non-volatile memory device interface 139 that is configured to transfer data, commands, and/or queries to the non-volatile memory media controller 126 over a bus 125, as described above.

Figure 1B:
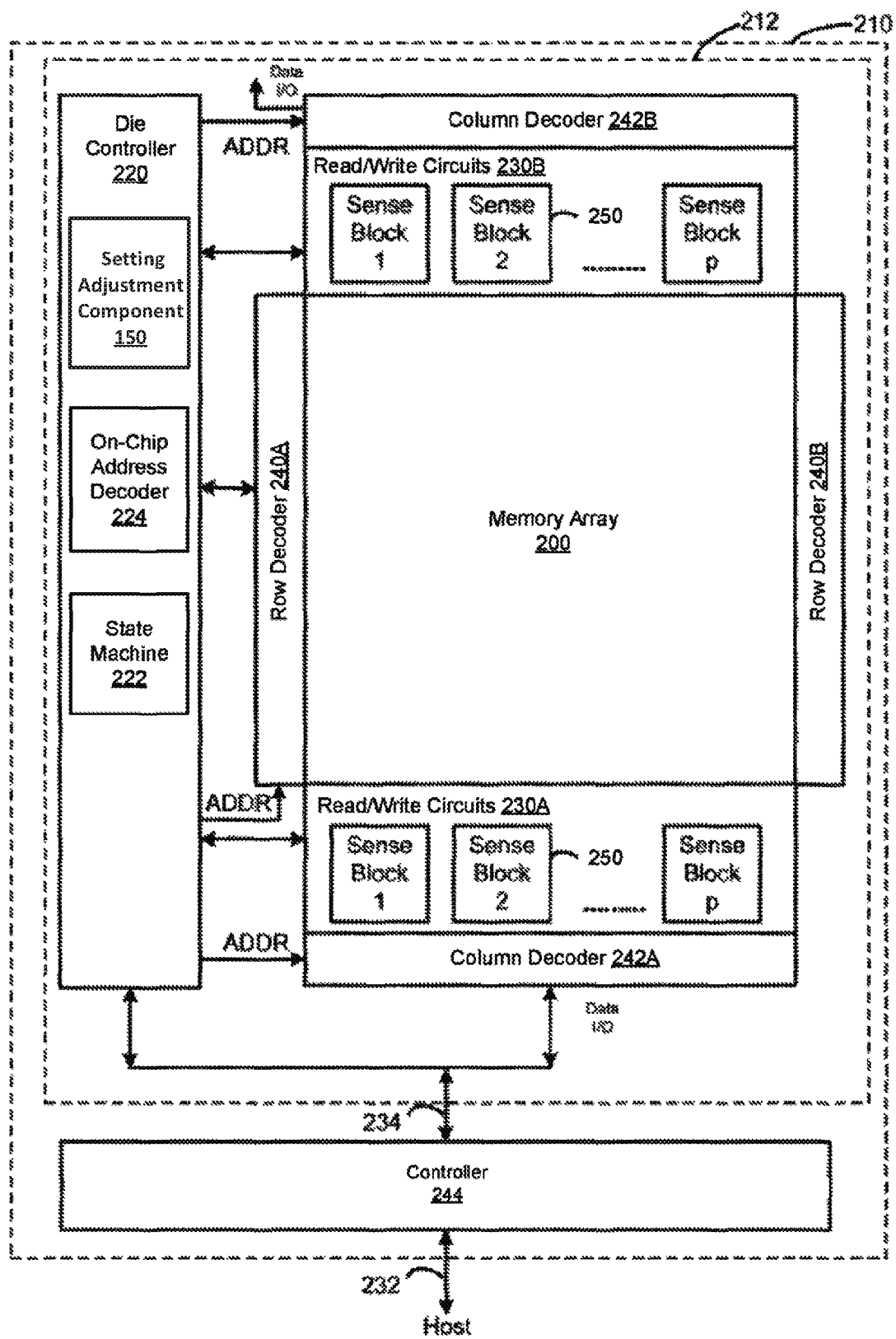
FIG. 1B illustrates an embodiment of a non-volatile storage device that may include one or more memory die or chips.

FIG. 1B illustrates an embodiment of a non-volatile storage device 210 that may include one or more memory die 212 or chips. Memory die 212, in some embodiments, includes a memory array 200 (two-dimensional or three dimensional) of memory cells, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/

230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same non-volatile storage device 210 (e.g., a removable storage card or package) as the one or more memory die 212. Commands and data are transferred between the host and controller 244 via lines 232 and between the controller and the one or more memory die 212 via lines 234. One implementation can include multiple memory die 212.

The die controller 220 may share a die with the memory array 200, such that the die controller 220 constitutes an "on-die" controller. The die controller 220 may have any form known in the art, including but not limited to microprocessors, microcontroller units (MCU's), finite state machines (FSM's), central processing units (CPU's), graphics processing units (GPU's), and the like; an "on-die controller" may refer to any of these.

Die controller 220, in one embodiment, cooperates with the read/write circuits 230A/230B to perform memory operations on the memory array 200. The die controller 220, in certain embodiments, includes a setting adjustment component 150, a state machine 222, and an on-chip address decoder 224. In one embodiment, the state machine 222 forms at least a portion of the setting adjustment component 150. In a further embodiment, the controller 244 forms at least a portion of the setting adjustment component 150. The controller 244 may optionally be positioned on one or more of the memory die 212, or may be on a die separate from the memory die 212.

In some embodiments, each of the memory arrays 200 may be an SLC (single-level cell) NAND array, in which each of the non-volatile memory elements 123, or "non-volatile storage cells," is programmable via application of a programming voltage across the cell. Each of the memory arrays 200 may further be programmable with a single pulse, providing speeds that approach the theoretical limit for programming NAND. As known in the art, each of the non-volatile memory elements 123 may have an electrically insulative element, such as a gate oxide layer or tunnel oxide layer, through which electrons are selectively movable, that provides a gate function by allowing the cells to be programmed with a charge and to retain the charge with which they are programmed. An "insulative element" or "insulative layer" may include any structure that is designed to selectively permit electrical charge to enter and/or leave a non-volatile storage cell.

Repeated application of the single pulse may cause degradation of such insulative layers over time. Such degradation may occur in the insulative elements of other non-volatile memory types besides floating gate and charge trap memory. The result may be over-programming of the non-volatile memory elements 123 with excessive charge, causing the threshold voltage of the non-volatile memory elements 123 to increase beyond a target threshold voltage.

Further, various factors, such as manufacturing variance, may cause such insulative elements to provide excessive resistance to passage of electrical current into the non-volatile memory elements 123. The result may be under-programming of the non-volatile memory elements 123 with insufficient charge, causing the threshold voltage of the non-volatile memory elements to diminish below a target threshold voltage.

Due to the variances and potential for insulative layer degradation mentioned previously, it may be desirable to modify programming settings used to program the non-volatile memory elements 123 over time. The phrase "programming setting" includes any parameters applicable to cell programming, including but not limited to the programming voltage applied, the programming current applied, the length of time the programming pulse is applied, the shape of the curve of programming pulse (for example, voltage or current over time), and the like. In certain embodiments, storing a programming setting may entail storing the programming setting, in numerical form. Alternatively, storing the programming setting may entail storing a pointer, flag, or other data structure that can be used to ascertain the programming setting, optionally with the aid of additional information such as a lookup table, decoding algorithm, or the like.

The phrase "programming voltage" refers to a voltage level applied to the non-volatile memory elements 123 which causes the non-volatile memory elements 123 to enter, or progress towards, a programmed state. This may be a peak voltage value, root mean square ("RMS") voltage value, an average voltage of a pulse, a voltage value of a particular pulse in a pulse train, and/or the like. "Programming voltage" is not limited to NAND memory, but may be applied to any non-volatile memory that is programmed through the application of an electrical potential. Thus, programming settings such as programming voltage may be adjusted, through use of the systems and methods of the present disclosure, in non-volatile memory types including, but not limited to, the non-volatile memory types listed in the background section above.

Similarly, various "sensing settings" may be used to sense the contents of one or more non-volatile memory elements 123 of the memory array 200. The term "sensing" refers to not just non-volatile memory structures with cells that hold electrical charge, but also to non-volatile memory types in which a different storage mechanism is used. For example, in some non-volatile memory types, a voltage and/or current is used to sense the resistance level of the cell (rather than stored charge). In other non-volatile memory types, current flow through the cell is detected; a current level above or below a particular threshold may indicate that a cell is programmed. Where the contents of individual cells are to be ascertained, this may be referred to as "reading" the cells. However, "sensing" the contents of a non-volatile memory array may include reading the contents of individual cells, or detecting individual or collective properties of the cells, such as whether the voltage or resistance of the cells is over or under a predetermined a threshold.

In some embodiments, modifying the programming settings may include reducing the programing voltage applied across the non-volatile memory elements 123 one or more times during the operating life of the non-volatile memory device 120, to extend the useful life of the non-volatile memory device 120 and reduce the likelihood of erroneous data reads due to cell over-programming.

For example, the processes used to manufacture non-volatile memory arrays may lead to the presence of significant variation in the ease with which the non-volatile memory elements 123 can be programmed. Thus, the default programming voltage of a new memory array 200 may cause under-programming or over-programming, even before any program/erase cycles have been performed. Consequently, it may be desirable to modify programming settings for reasons other than the need to compensate for material degradation. Programming settings may need to be adjusted in different ways for each memory array 200. Such adjustments may entail adjusting the programming voltage upward and/or downward, with both upward and downward adjustments needed in some instances in the course of the operating life of the memory array 200.

Further, the increasing threshold voltage that may happen due to material degradation may not occur uniformly across all of the non-volatile memory elements 123. Rather, due to differences in manufacturing and/or different utilization, the materials, such as insulators, of some of the non-volatile memory elements 123 may degrade more rapidly than others. Accordingly, it may be desirable to adjust programming settings independently across various groupings of the non-volatile memory elements 123. For example, programming settings may be determined independently for each of the memory arrays 200, for each block within a memory array 200, or even for each word line within a memory array 200. The retention and use of more granular programming settings may beneficially account for small-scale changes in the performance of the memory array 200, such as differences between word lines or blocks of the memory array 200. However, such granularity increases the storage space required to store the programming settings, and also increases the time required to program cells, as a larger number of programming settings need to be read and/or stored for immediate use (for example, in a registry of a controller that implements the setting adjustment component 150). Accordingly, there are some tradeoffs regarding the scope of applicability of each programming setting.

The setting adjustment component 150, in one embodiment, is configured to modify one or more of the programming settings of one or more word lines, blocks, and/or memory arrays 200 over time. Programming settings may be word line specific, block specific, or memory array specific, as mentioned above.

In some examples, the setting adjustment component 150 may reduce the programming voltage used to program the non-volatile storage cells of a word line, block, or memory array 200 one or more times during the operating life of the memory array 200. In some embodiments, the setting adjustment component 150 may adjust the programming voltage of the memory array 200 multiple times, in steps, throughout the operating life of the memory array 200. Further, the setting adjustment component 150 may maintain and/or independently adjust distinct programming voltages for different blocks and/or word lines of the memory array 200. In order to accomplish this, the setting adjustment component 150 may test some or all of the non-volatile memory elements 123 of the memory array 200 to determine whether over-programming of the non-volatile memory elements 123 is occurring with the current programming voltage. Notably, "over-programming" refers to any programming operation in which one or more of the non-volatile memory elements 123 receive more charge than needed to change the threshold voltage of the cell to fall within the target range of threshold voltages. The excessive charge need not be sufficient to cause read errors. Indeed, it may be desirable to diagnose over-programming and take corrective action before the over-programming becomes severe enough to cause the over-programmed cells to be erroneously read.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the setting adjustment component 150. The setting adjustment component 150, in some embodiments, adjusts the programing voltage applied to the memory array 200, as mentioned previously. The setting adjustment component 150, in certain embodiments, is embodied as software in a device driver, hardware in a controller 244, and/or hardware in a die controller 220 and/or state machine 222.

In one embodiment, one or any combination of die controller 220, setting adjustment component 150, on-chip address decoder 224, state machine 222, decoders 242A, decoders 242B, decoders 240A, decoders 240B, read/write circuits 230A, read/write circuits 230B, and/or controller 244 can be referred to as one or more managing circuits.

Figure 2A:
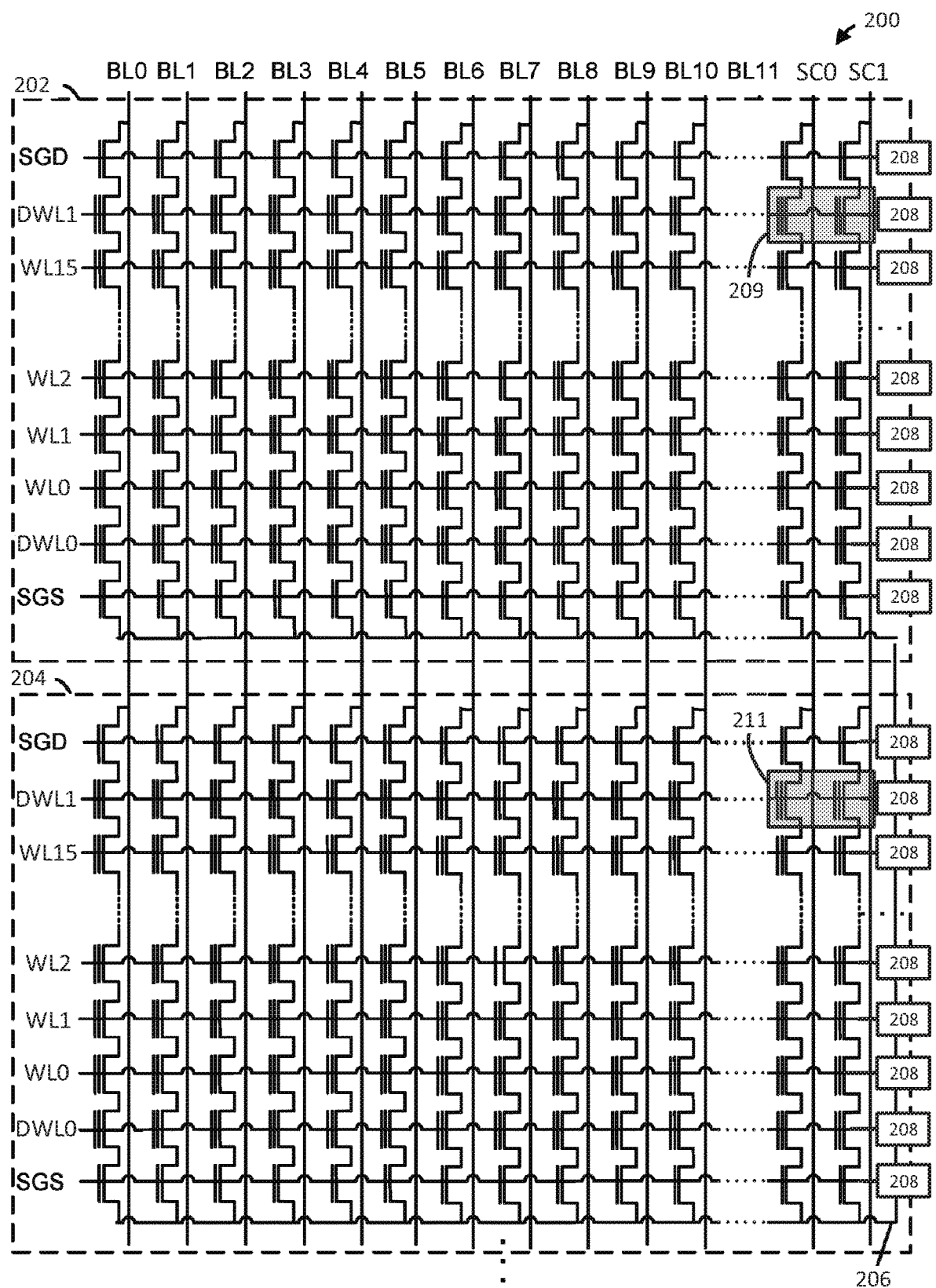
FIG. 2A depicts blocks of memory cells in an example 2D configuration of the memory array of FIG. 1.

FIG. 2A depicts blocks of memory cells in an example 2D configuration of the memory array 200 of FIG. 1B. The memory array 200 can include many blocks. Each example block 202, 204 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate SGS which, in turn, is connected to a common source line 206. Sixteen word lines, for example, WL0-WL15, extend between the source select gates and the drain select gates.

In some cases, dummy word lines, which contain no user data, can also be used in the memory array adjacent to the select gate transistors (SGS/SGD). Such dummy word lines can shield an edge data word line from certain edge effects. In some examples, dummy word lines are positioned adjacent to the SGD and SGS lines. Thus, in the exemplary embodiment of FIG. 2A, dummy word lines DWL0 are positioned adjacent to the SGS lines of each of the blocks 202, 204, and dummy word lines DWL1 are positioned adjacent to the SGD lines of each of the blocks 202, 204. In other examples, multiple (for example, two or three) dummy word lines are positioned between the word lines WL0 through WL15 and each of the SGD and SGS lines. In some embodiments, the dummy word lines are not erased with the rest of the block 202, 204 to which they belong. Thus, any data stored on the dummy word lines will persist through the erase operations customarily used to erase user data, and can only be modified by programming bits of the dummy word lines that have not yet been programmed.

As embodied in FIG. 2A, the bit lines BL0, BL1, . . . define columns of the word lines of each block 202, 204. In addition to the bit lines BL0, BL1, . . . that store user data, each block 202, 204 has a plurality of spare columns SC0, SC1, . . . , that may be used for various purposes, such as the replacement of the bit lines BL0, BL1, . . . that are, or become, unusable. As such, the spare columns, in some instances, do not store user data.

Each of the word lines of the memory array 200 may have a word line driver 208 that decodes and/or otherwise processes the data from that word line. Thus, in FIG. 2A, the word lines WL0 through WL15 may have word line drivers 208, as shown. The word line drivers 208 may be included in the row decoders 240A/240B shown in FIG. 1B.

It may be desirable to store the programming setting(s) in a location of the memory array 200 not normally occupied by user data. Thus, the overhead needed to store and/or locate the programming settings may be reduced, and the programming settings may be more resistant to power loss in the memory array 200. Further, the programming setting(s) may persist through erase operations carried out with respect to the user data.

Accordingly, in some examples, the programming setting(s) may be stored in a setting segment distinct from a user data segment in which the user data is stored. Thus, the programming setting(s) may not be erased when user data in the same memory array 200, the same block, or even the same word line is erased.

In some embodiments, one or more programming settings may be stored on one or more of the dummy word lines and/or spare columns of the memory array 200. By way of example, one or more programming settings may be stored in one or more cells that are part of both the dummy word lines and the spare columns. For example, a subset 209 of the non-volatile memory elements 123 of the memory array 200 may be located on the dummy word line DW1 of the block 202, and may include the non-volatile memory elements 123 of some of the spare columns (for example, at least SC0 and SC1, as shown) of the block 202.

The subset 209 may act as a setting segment of the memory array 200, while the remainder of the array (the conventional columns of the remaining word lines) may act as a data segment, or a user data segment. A "setting subset" is a grouping of non-volatile storage cells that is set aside for the storage of one or more settings, such as programming settings. A "data subset" is a grouping of non-volatile storage cells in which other data that does not include programming settings, such as user data, can be stored. A "user data subset" is a grouping of non-volatile storage cells set aside for storage of user data.

In some embodiments, programming settings may be word line-specific. Thus, it may be desirable to have the programming setting for a given word line reside on that word line, in associated spare column(s). Where programming settings are stored on word lines that are not dummy word lines (i.e., word lines that store user data), programming settings may be erased along with the word line to which they pertain. Thus, the setting adjustment component 150 may be configured to re-write such programming settings immediately after the word line has been erased.

In alternative embodiments, programming settings may be block-specific. Thus, programming settings may be stored on one or more word lines within the block to which they pertain. Optionally, a programming setting for a block may be divided across multiple dummy word lines. For example, a one-byte programming setting may be stored on eight dummy word lines of a single column, with a bit on each of the dummy word lines. Alternatively, a single dummy word line may store the programming setting for the block, with the optional storage of multiple iterations of the programming setting on the word line for redundancy. This is the example illustrated in FIG. 2A, in which the subset 209 stores a programming setting for the block 202. If desired, a subset 211 of the non-volatile memory elements 123 of the block 204, located on the spare columns of the dummy word line DWL1 of the block 204, may store a programming setting for the block 204.

It may be advantageous for programming settings to be stored proximate the word line drivers for the word lines on which they are stored. This may expedite retrieval of the programming settings, thereby expediting programming operations because cells proximate the word line driver experience significantly less RC delay, because of the shorter distance between the memory cells and the word line driver delivering the pulse. Thus, storing the programming settings in the spare columns of each block 202, 204, and more particularly, in the spare columns adjacent to the word line driver 208 for the word line on which they are stored, may have the additional advantage of positioning the programming settings for more rapid retrieval and utilization. Storing the programming settings on the subset 209 and/or the subset 211 may provide such a benefit.

The non-volatile memory elements 123 may include any of a wide variety of technologies, including but not limited to all of the non-volatile memory types referenced in the background above. One type of non-volatile memory which may be provided in the memory array is a charge-trapping memory cell. Other types of non-volatile memory can also be used. For example, a charge-trapping memory cell may use a non-conductive dielectric material in place of a conductive floating gate to store charge in a non-volatile manner. In an example, a triple layer dielectric formed of silicon oxide, silicon nitride and silicon oxide ("ONO") is sandwiched between a conductive control gate and a semiconductor. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
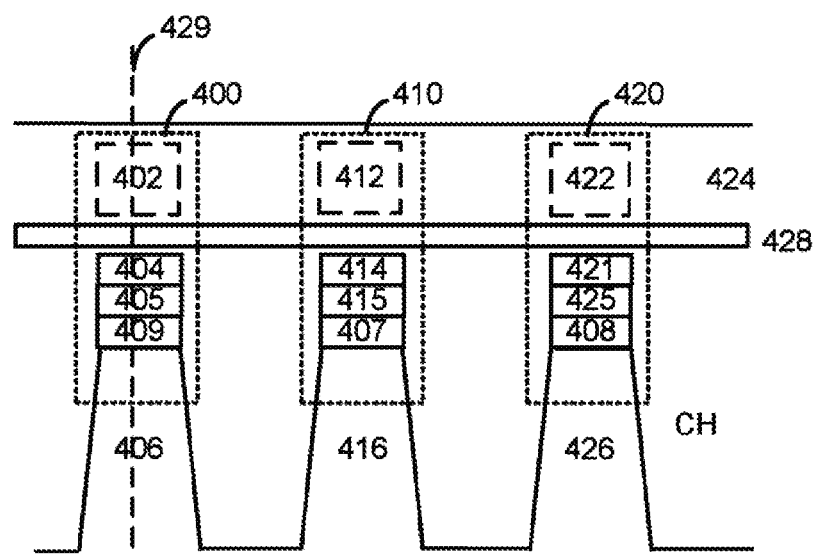
FIG. 2B depicts a cross-sectional view of example charge-trapping memory cells in NAND strings, as an example of memory cells in FIG. 2A.

FIG. 2B depicts a cross-sectional view of example charge-trapping memory cells in NAND strings, as an example of memory cells in FIG. 2A. The view is in a word line direction of memory cells comprising a flat control gate and charge-trapping regions as a 2D example of memory cells in the memory array 200 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405, and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

One advantage of a flat control gate is that the charge-trapping layer can be made thinner than a floating gate. Additionally, the memory cells can be placed closer together.

Figure 2C:
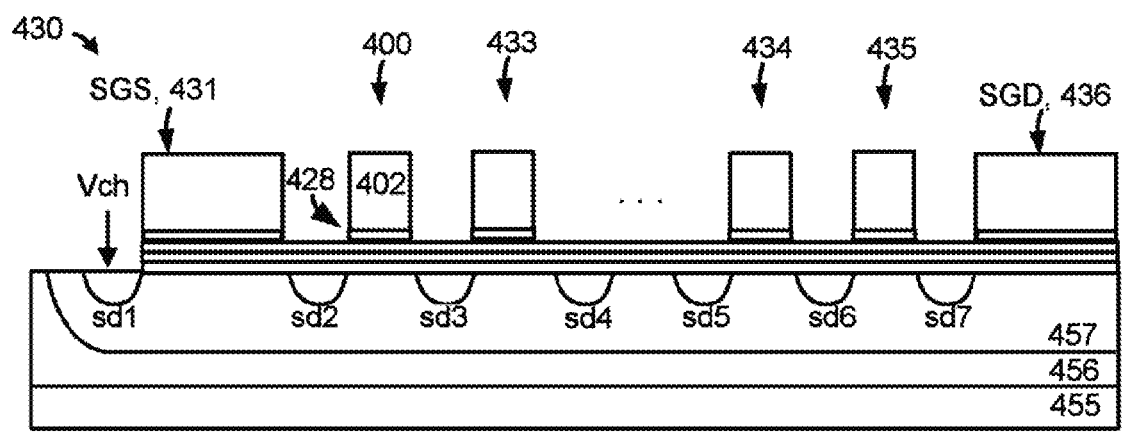
FIG. 2C depicts a cross-sectional view of the structure of FIG. 2B.

FIG. 2C depicts a cross-sectional view of the structure of FIG. 2B along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel region 406.

Figure 2D:
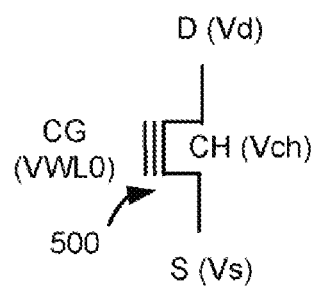
FIG. 2D depicts an example memory cell.

FIG. 2D depicts an example memory cell 500. The memory cell comprises a control gate CG which receives a word line voltage Vwll0, a drain at a voltage Vd, a source at a voltage Vs and a channel at a voltage Vch.

Figure 3:
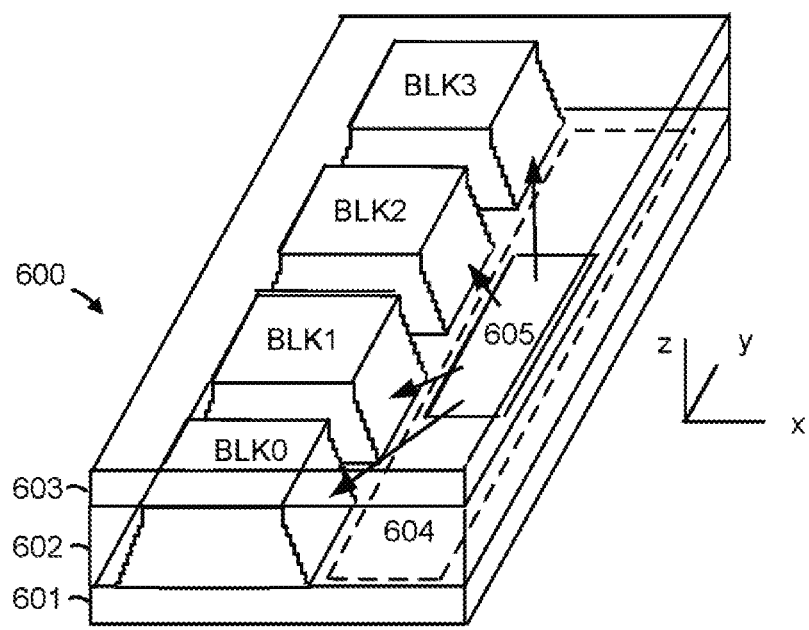
FIG. 3 is a perspective view of a memory device comprising a set of blocks in an example 3D configuration of the memory array of FIG. 1.

FIG. 3 is a perspective view of a memory device 600 comprising a set of blocks in an example 3D configuration of the memory array 200 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
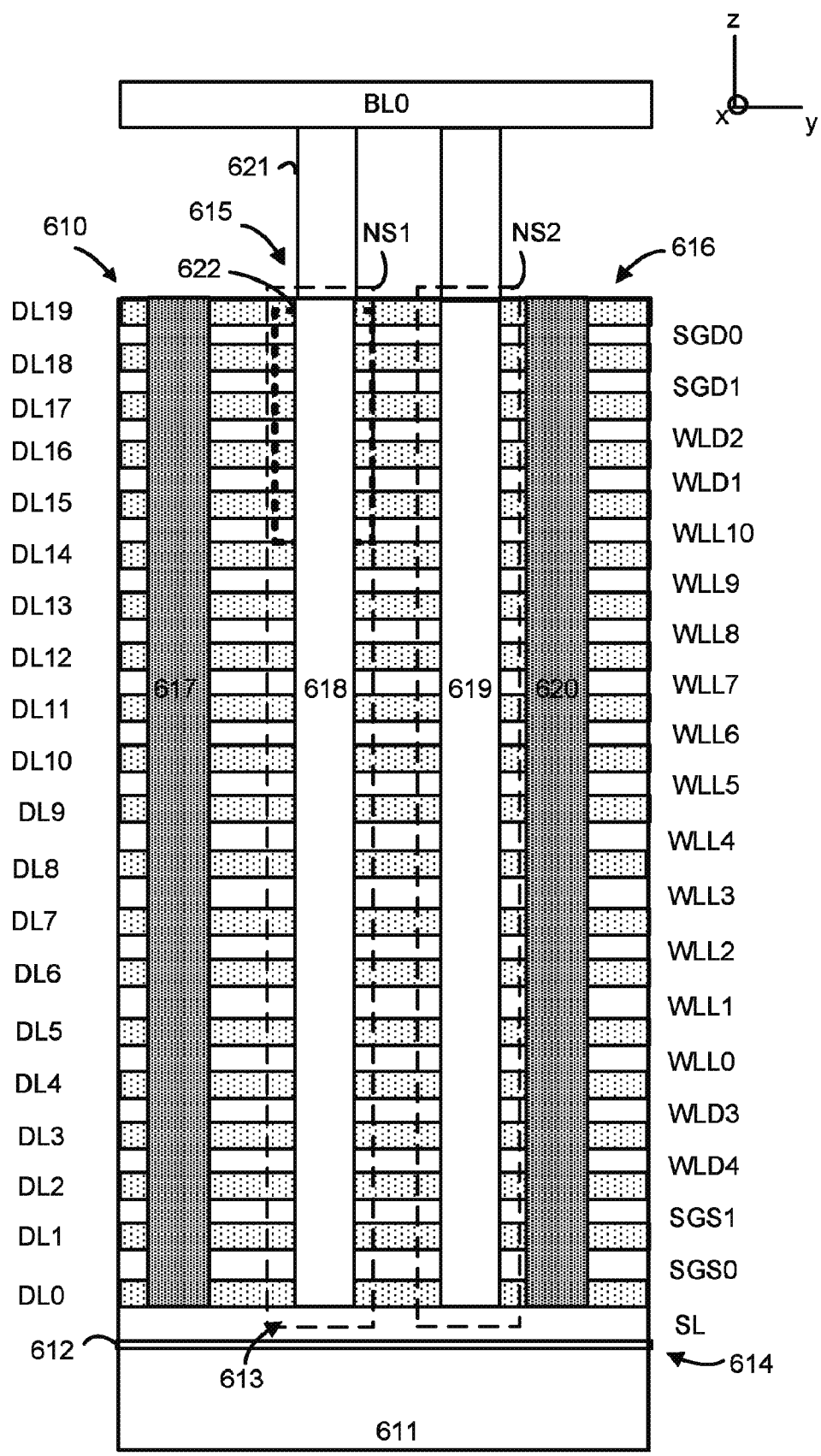
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 5.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 5:
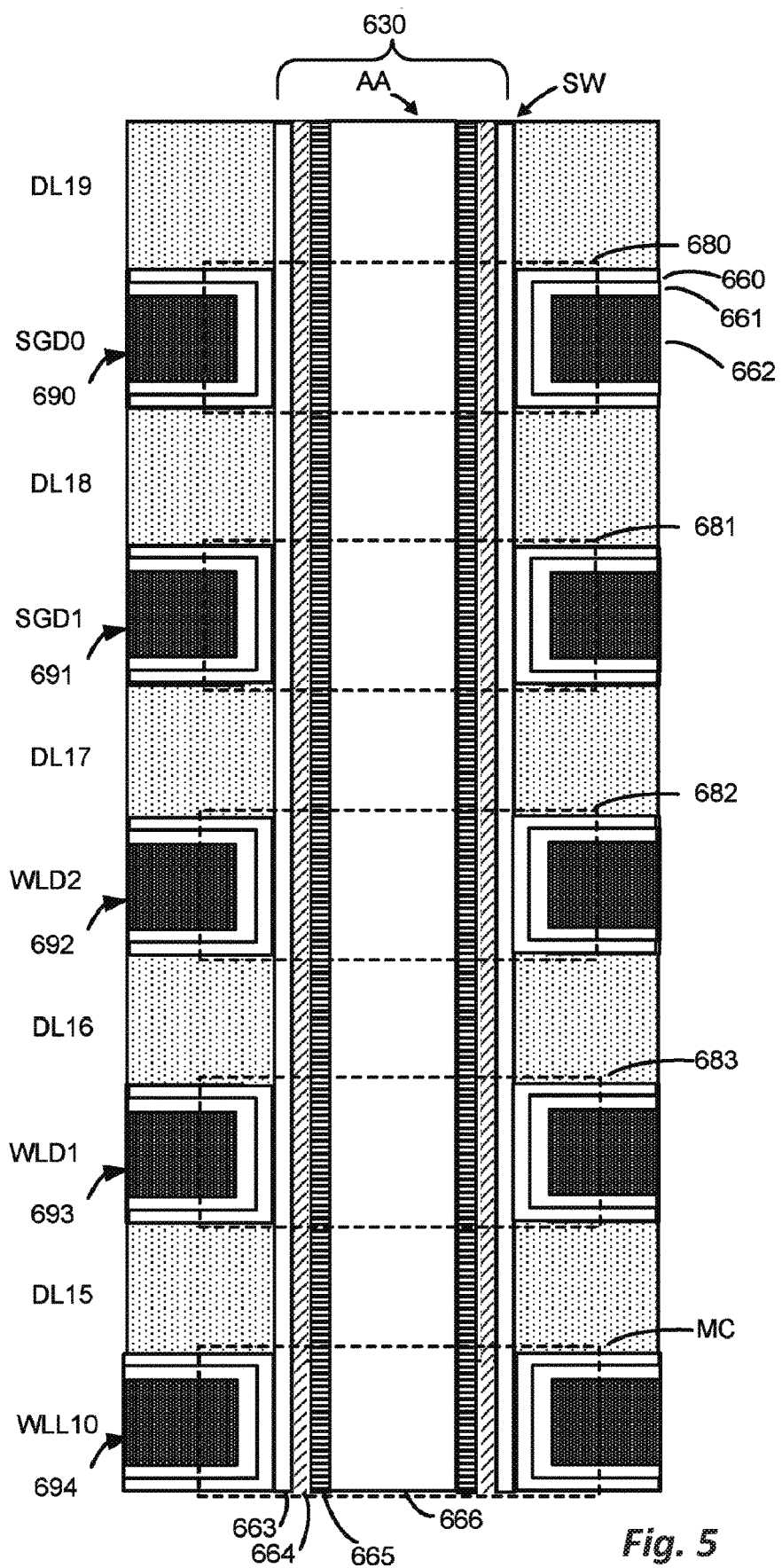
FIG. 5 depicts a close-up view of a region of the stack of FIG. 4.

FIG. 5 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer 663 or film such as SiN or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 6:
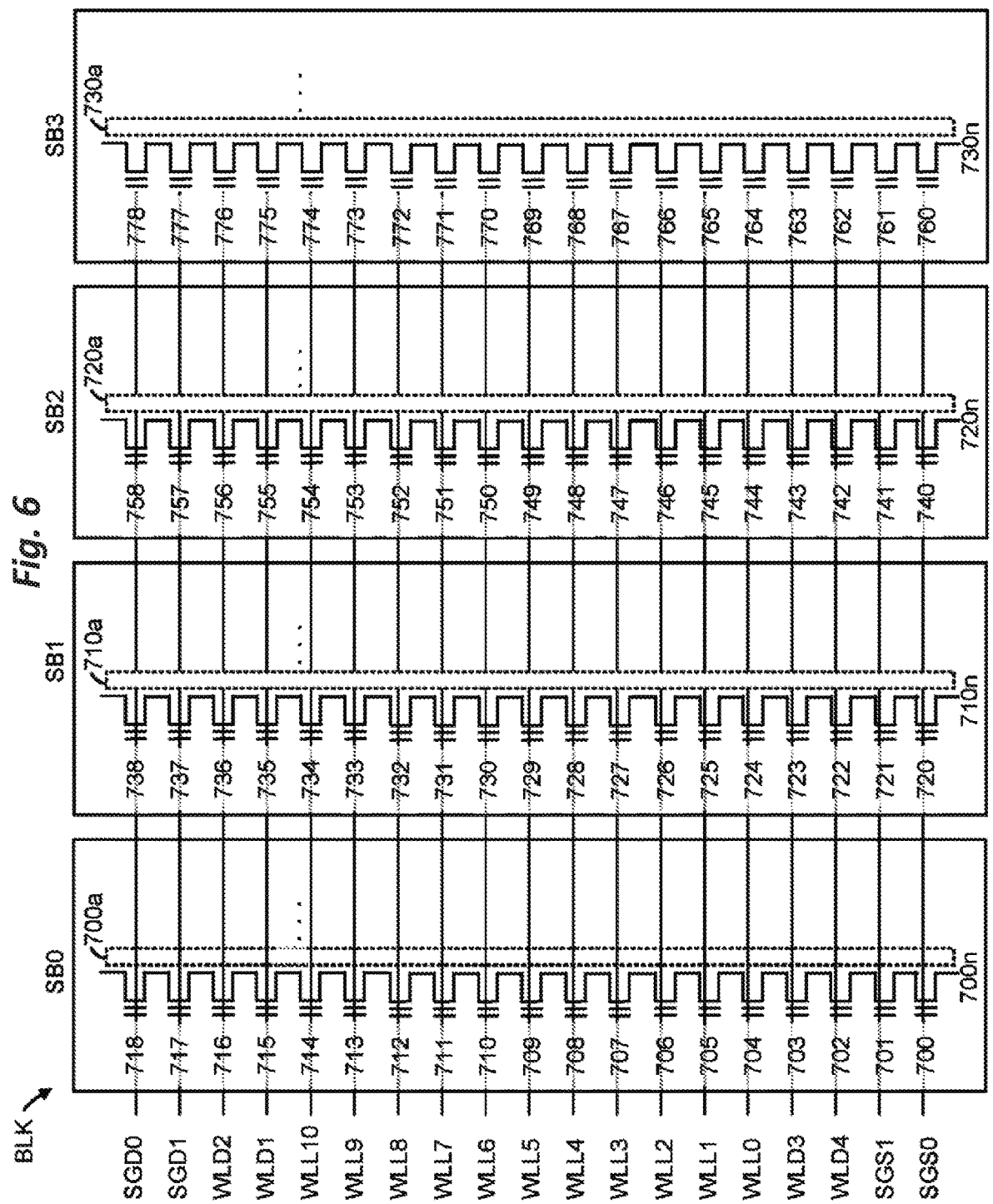
FIG. 6 depicts an example view of NAND strings in sub-blocks in a 3D configuration which is consistent with FIG. 4.

FIG. 6 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700 n, 710 n, 720 n and 730 n have channel regions 700 a, 710 a, 720 a and 730 a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

Figure 7:
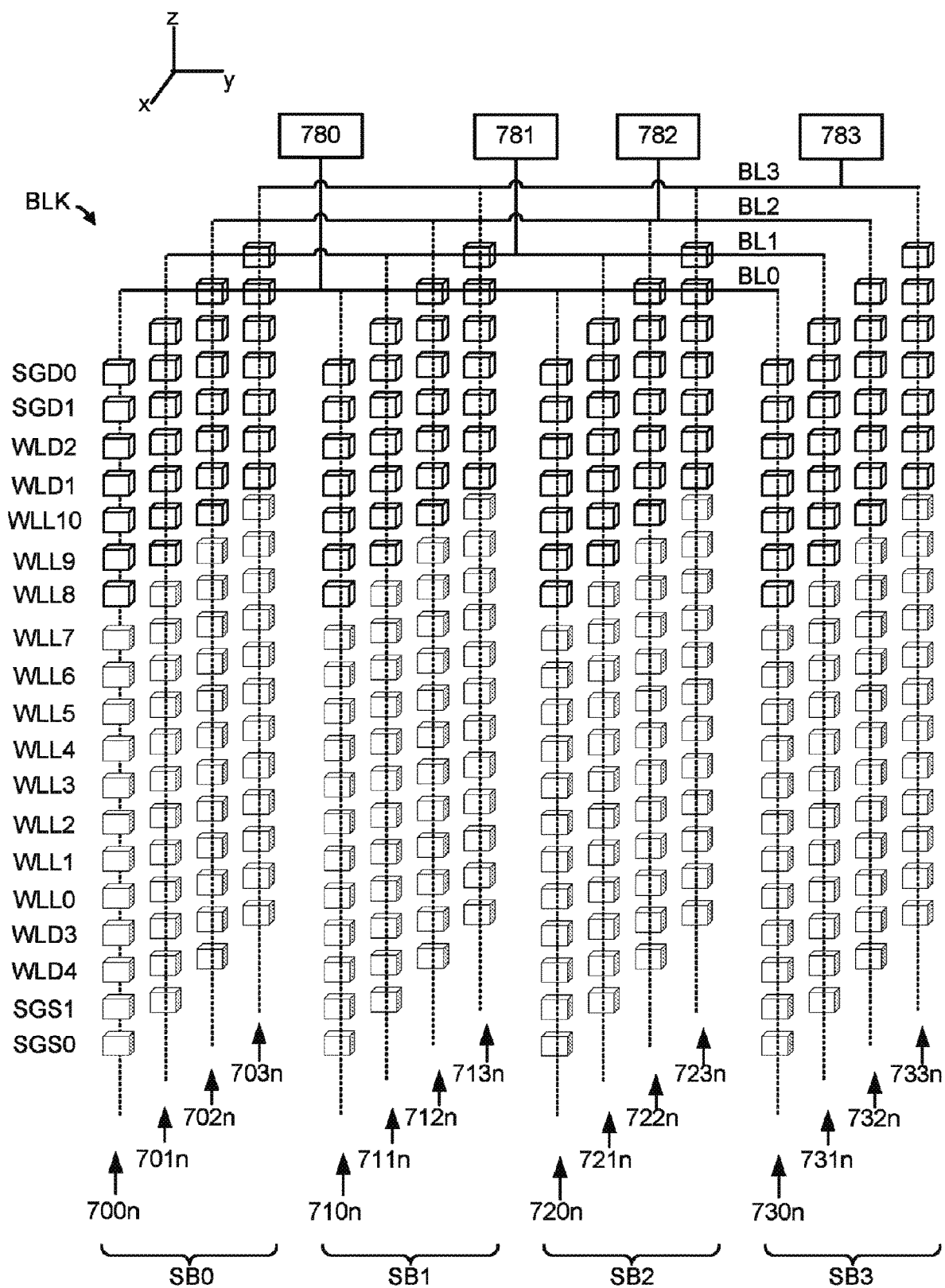
FIG. 7 depicts additional detail of the sub-blocks SB0-SB3 of FIG. 8A.

FIG. 7 depicts additional detail of the sub-blocks SB0-SB3 of FIG. 6. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3.

FIG. 8A depicts example Vth distributions of memory cells, where two data states are used, and a shift in Vth is observed. Threshold voltage shift may happen gradually and/or permanently as additional programming and/or erase cycles are carried out. For example, degradation of one or more insulative layers that control the energy required to program a cell, may cause the cell to become easier to program over time, causing the threshold voltage to gradually increase (for example, the distribution may shift from curve 801a to curve 801 in FIG. 8A as a result of these repeated program and erase cycles).

In FIGS. 8A and 8B, the Vth distributions with a dashed line represent an initial state of a set of storage cells, such as those on a word line, those in a set of word lines, those in a block, or those in an entire memory device, prior to the occurrence of a significant number of programming/erase cycles. The Vth distributions with a solid line represent the state of the storage cells after the occurrence of a number of programming/erase cycles.

During a programming operation, the final Vth distribution can be achieved by using one or more programming passes. A multiple-pulse programmed storage device may be programmed through the use of multiple programming passes. Conversely, a single pulse programmed storage device may be programmed via a single programming pass, or a single pulse. For multiple-pulse programming, each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

A Vth distribution 800 represents an erased state (Eslc), a Vth distribution 801 represents a programmed data state (Pslc) with a Vth upshift due to degradation in the insulative elements of the storage cells caused by the performance of previous programming/erase operations, and a Vth distribution 801a represents Pslc without a Vth upshift, as would be the case before the performance of a number of programming/erase operations. In other words, the Vth distribution 801 has an upshift relative to the Vth distribution 801a. The erased state may represent a one bit while the programmed state represents a zero bit, for example. A verify voltage for the programmed state is VvSLC and a read voltage for distinguishing between the two states is VrSLC in the normal read situation or VrSLCa in the first read situation. VrSLCaVrSLC because the lower tail of the Vth distribution 801a is lower than the lower tail of the Vth distribution 801. Generally, a read voltage for distinguishing between adjacent states, e.g., a lower state and a higher state, should be located midway between the expected upper tail of the Vth distribution of the lower state and the expected lower tail of the Vth distribution of the higher state.

FIG. 8B depicts example Vth distributions of memory cells, where four data states are used, and a shift in Vth is observed. The data states are represented by Vth distributions for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

Notably, the Vth upshift (or possibly, downshift) in each of the Er, A, B, and C states may be different. For example, lower states may experience a greater upshift, while higher states may experience a comparatively lower upshift, or even a downshift in Vth. In the example of FIG. 8B, the Vth distributions 810, 811 and 812 for the Er, A and B states, respectively, have a Vth upshift due to breakdown of the insulative layer that controls the energy (for example, programming voltage) required to program the cell, as described above. The Vth distributions 810a, 811a and 812a measured prior to occurrence of programming/erase cycles do not have the Vth upshift. Further, the upshift for the A state is greater than for the B state. The Vth distribution 813 for the C state has a Vth downshift in the normal read situation compared to the Vth distribution 813a of the first read situation. For the higher states, the coupling up potential of the channel to the word line is typically not strong enough to trap more electrons in the charge trapping layer of a cell. This is due to a screening effect of the electrons which are already present in the charge trapping layer of the cell and provide the high Vth. Instead, the electrons in the charge trapping layer are more attracted towards the control gate, resulting in a Vth downshift. Data retention effects may also be present for the higher states in which charge is lost from the charge trapping layer.

The occurrence of different upshifts in a multiple-level cell (MLC) storage device may be addressed, for example, by adjusting programming settings, such as programming voltages, differently for each state to be programmed. For the example of FIG. 8B, a larger programming voltage reduction may be used to program a cell to one of the lower states, while a comparatively smaller programming voltage reduction (or even a programming voltage increase) may be used to program a cell to one of the higher states.

Figure 9:
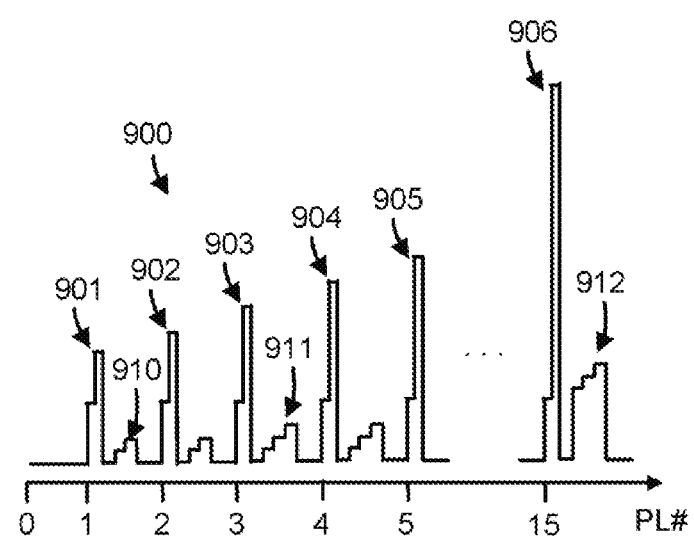
FIG. 9 depicts a waveform of an example programming operation.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIGS. 8A and 8B.

Each program voltage includes two steps, in one approach. Further, Incremental Step Pulse Programing (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

Figure 10:
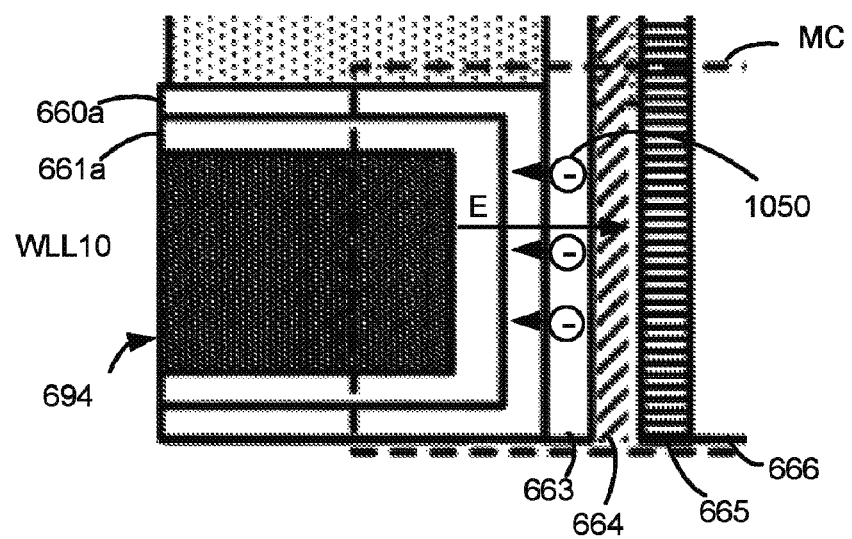
FIG. 10 depicts a portion of the memory cell MC of FIG. 5 showing electron injection into a charge trapping region during weak programming.

FIG. 10 depicts a portion of the memory cell MC of FIG. 5 showing electron injection into a charge trapping region during weak programming. The memory cell includes a control gate 694, a metal barrier 661a, a blocking oxide 660a, a charge-trapping layer 663, a tunneling layer 664, a channel 665 and a dielectric core 666. Due to the elevated word line voltage, an electric field (E) is created which attracts electrons (see example electron 1050) into the charge trapping layer, increasing the Vth. This weak programming may be caused by the Poole-Frenkel effect, in which an electrical insulator can conduct electricity. This is a kind of electron tunneling through traps.

Vth shift may be particularly prevalent in 3D NAND flash memory structures, particularly where single-pulse programming is used. Single-pulse programming may, over time, result in degradation of one or more insulative elements of each cell. Such layers may include, but are not limited to, the charge-trapping layer 663 and the tunneling layer 664 of FIG. 5. The result may be that, as the same programming voltage VPGM continues to be applied, excess charge may enter the cells, causing the threshold voltage Vth to be excessive. If this effect is not mitigated, the increase in Vth may cause the over-programmed cells to be erroneously read. Further, single-pulse programmed memory arrays may be particularly sensitive to changes in the ease with which memory cells are programmed because the threshold voltage of the cell may be entirely dependent upon the characteristics of that one pulse. Thus, it may be of particular importance to have the proper programming settings, such as programming voltage, for single-pulse programmed memory arrays.

The setting adjustment component 150 may help stabilize Vth by adjusting one or more programming settings. In general, as described above, the setting adjustment component 150 may determine the programming voltage to be used to program some, or all, of the non-volatile memory elements 123 of a memory array, such as the memory array 200. setting adjustment component 150

In one embodiment, the voltage adjustment component performs a read operation on the portion of the memory array 200 in which one or more program settings (hereafter assumed to be a single program setting, by way of example) are stored. As mentioned previously, the storage setting may optionally be stored in one or more spare columns of one or more dummy word lines of the memory array 200. Additional options for storage of programming settings are set forth in U.S. Pat. No. 7,808,819, which is incorporated herein by reference.

In one embodiment, the setting adjustment component 150 uses the programming setting to program the non-volatile memory elements 123. The setting adjustment component 150 may function in connection with other components, such as the die controller 220, to program the non-volatile memory elements 123.

In one embodiment, the voltage adjustment component determines whether the programming setting should be changed by determining whether over-programming of one or more of the non-volatile memory elements 123 is occurring with the programming setting. Where the programming setting is the programming voltage used to program the non-volatile memory elements 123, over-programming may indicate that the programming voltage should be reduced for future programming operations. The setting adjustment component 150 selects a revised and/or updated programming setting to be used in future operations, in place of the programming setting that was used previously.

In some embodiments, the setting adjustment component 150 stores the updated programming setting in the designated portion of the memory array 200. Where the updated programming setting is stored in a dummy word line, as described above, the setting adjustment component 150 stores an updated programming setting in the designated portion of the memory array 200 without first erasing the programming setting that was used previously. Rather, in some embodiments, the setting adjustment component 150 programs one or more bits of the subset of memory containing the programming setting (for example, from "1" to "0") to change the programming setting to the updated programming setting. In this way, the updated programming setting is stored in the same location as the programming setting that was previously used without first erasing the previous programming setting. This aspect will be described in greater detail subsequently.

Various functions of the setting adjustment component 150 may be implemented in circuits, such as logic circuits, of a controller such as the die controller 220. One exemplary configuration of the die controller 220 will be shown and described in connection with FIG. 11.

Figure 11:
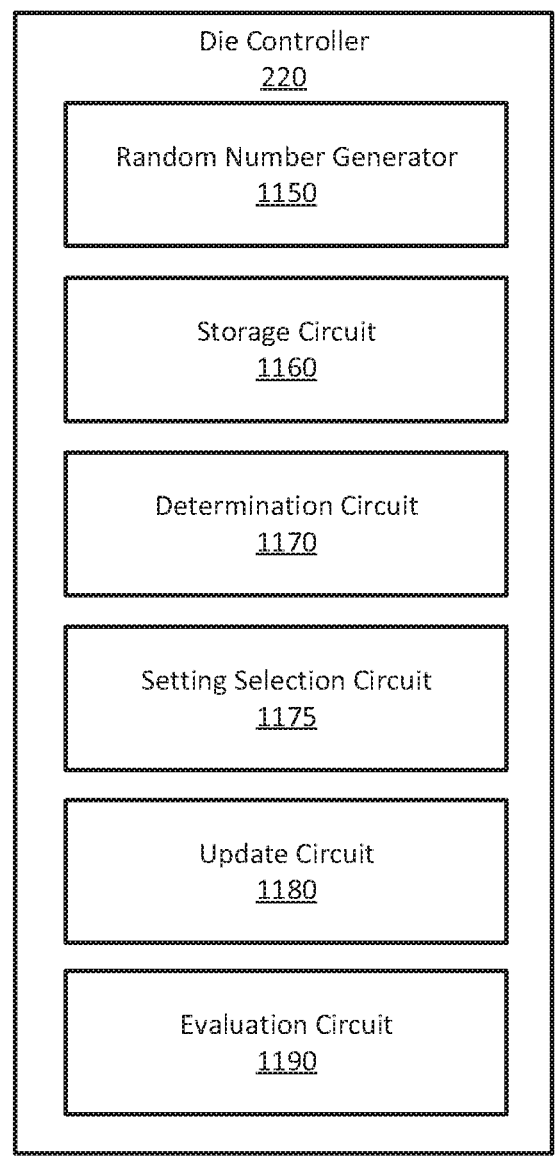
FIG. 11 depicts one embodiment of the die controller of FIG. 1B.

FIG. 11 depicts one embodiment of the die controller 220. In general, as described above, the die controller 220 may serve many functions; one of these may be implementation of the setting adjustment component 150 to determine the programming voltage to be used to program some or all of the non-volatile memory elements 123 of the memory array 200. In the depicted embodiment, the die controller 220 includes random number generator 1150, a storage circuit 1160, a determination circuit 1170, a setting selection circuit 1175, an update circuit 1180, and an evaluation circuit 1190.

In various embodiments, the random number generator 1150 generates a random number, which may be used to determine whether the programming settings are to be evaluated prior to generation of a new random number. Any random number generation circuitry known in the art may be used in the random number generator 1150.

In some embodiments, the storage circuit 1160 carries out programming and/or erase operations on the non-volatile memory elements 123 of the memory array 200. The storage circuit 1160 utilizes the programming settings stored on the memory array 200 to write data to the non-volatile memory elements 123.

In some embodiments, the determination circuit 1170 determines whether one or more of the programming settings stored on the memory array 200 need to be updated and/or determine the appropriate updated programming setting(s) for future programming procedures. An "updated programming setting" is a programming setting that is different from that which was previously used in the performance of one or more programming operations for the same set of cells.

In various embodiments, the setting selection circuit 1175 determines the appropriate value for the updated programming setting(s). The setting selection circuit 1175 may make a quantitative determination, for example based on the extent of the over-programming or under-programming detected by the determination circuit 1170. Alternatively, the setting selection circuit 1175 may select the updated programming setting from a list, table, or other predetermined set of values. For example, the setting selection circuit 1175 may reference a lookup table, or the like, in order to select the updated programming setting based on the number of programming settings updates that have been made, or the value of a previous programming setting. Where the programming setting includes a programming voltage, the setting selection circuit 1175 may select an updated programming voltage different from the programming voltage that was used previously.

In some embodiments, the update circuit 1180 implements updates to the programming settings, per the value(s) determined by the setting selection circuit 1175. Thus, the update circuit 1180 may store one or more updated programming settings in the memory array 200. In some examples, the update circuit 1180 stores the updated programming setting(s) without first erasing the programming setting(s) used previously, as will be described in greater detail in connection with FIG. 14.

In some embodiments, the evaluation circuit 1190 assesses whether it would be beneficial to cause the determination circuit 1170 to determine whether the programming setting(s) are to be updated. The evaluation circuit 1190, in some implementations, determines whether a trigger has occurred, and initiates operation of the determination circuit 1170 upon receipt of the trigger. Thus, in order to expedite write operations, the determination circuit 1170 need not perform the determination for every write cycle; rather, it may be sufficient to assess the efficacy of the programming setting(s) only every n write cycles. The value of n may be relatively small, such as 1, 2, 4, 8, or 16. In the alternative, a larger n value, such as 32, 64, 128, 256, 512, or 1024, may be used to cause the determination circuit 1170 to operate even less frequently. The value of n need not be a power of two; the numbers set forth above are merely exemplary.

The trigger, in some embodiments, is the occurrence of a random number, generated by the random number generator 1150, which falls within a predetermined and/or predefined range or has a predetermined and/or predefined value. In other embodiments, the trigger is a number of programming/erase cycles, read cycles, and/or the like. In some embodiments, where a random number is generated and evaluated with each programming cycle, the programming setting(s) may be assessed after a random number of programming operations. The average number of programming cycles between evaluations of the programming setting(s) may be determined by the probability of the random number meeting one or more criteria to trigger the evaluation. In this manner, random number generation may be used in place of storage and retrieval of cycle count information to trigger evaluation of the programming setting(s) with a frequency less than once per programming cycle.

In one exemplary embodiment, the evaluation circuit 1190 triggers assessment of the programming setting(s), on average, every sixteen programming cycles, by initiating operation of the determination circuit 1170 only when the random number generator 1150 generates a specific number ranging from 0 to 15. For example, the random number generator 1150 of FIG. 11 may be used to generate four bits at random. When the four bits are a particular combination of values (for example, "1111" or the like), the evaluation circuit 1190 may initiate operation of the determination circuit 1170 to determine whether one or more programming settings are to be changed.

Figure 12:
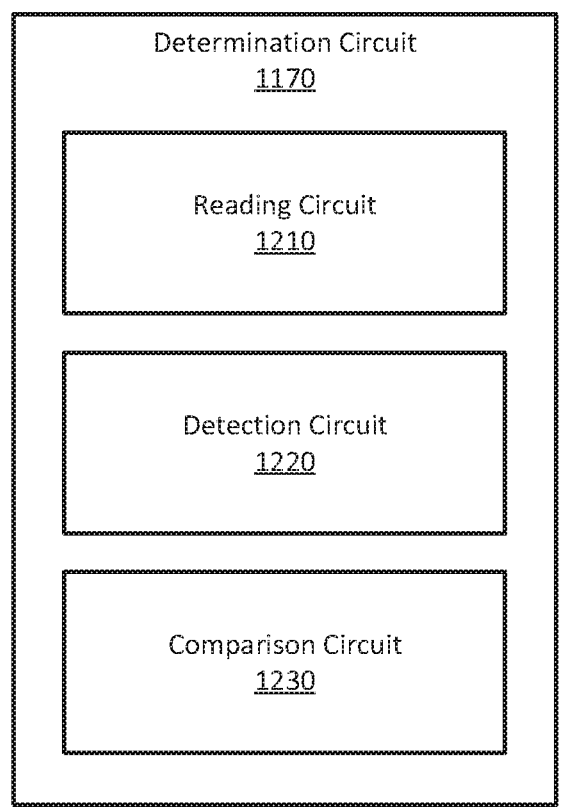
FIG. 12 depicts one embodiment of the determination circuit of FIG. 11.

FIG. 12 depicts one embodiment of the determination circuit 1170 of FIG. 11. In some embodiments, the determination circuit 1170 includes a reading circuit 1210, a detection circuit 1220, and a comparison circuit 1230. In some embodiments, the reading circuit 1210 reads some, or all, of the non-volatile memory elements 123 of the memory array 200. In alternative embodiments, the reading circuit 1210 conducts a program verify operation at a detection voltage (Vdetect). The detection circuit 1220 may detect/count the number of bits read below Vdetect. The comparison circuit 1230 may compare the number of bits read with a predetermined or predefined level, value and/or range.

In some embodiments, the comparison circuit 1230 determines that, if the number of bits read below the detection voltage is greater than or equal to a predefined value, over-programming is not occurring and/or will not occur in programming operations to be carried out in the near future. Conversely, if the number of bits read below the detection voltage is at or below the predefined level, the comparison circuit 1230 determines that over-programming is occurring and/or will occur in programming operations to be carried out in the near future.

In the alternative, the number of programmed bits above the detection voltage may be detected. If this number is greater than a predefined level, the comparison circuit 1230 may determine that over-programming is occurring. If it is less than or equal to the predefined level, the comparison circuit 1230 may determine that over-programming is not occurring.

According to another alternative embodiment, an error condition, such as the detection of one or more fail bits, is detected by the detection circuit 1220. The comparison circuit 1230 may then use the error condition, or a quantity (such as a number of fail bits) connected to the error condition, to determine whether over-programming is occurring.

FIG. 12 represents the determination circuit 1170 according to just one exemplary embodiment. Those of skill in the art will recognize that over-programming may be detected in a wide variety of ways besides those described above. Further, those of skill in the art will recognize that similar or different steps may be used to detect other potential problems with the memory array 200, such as under-programming.

Figure 13:
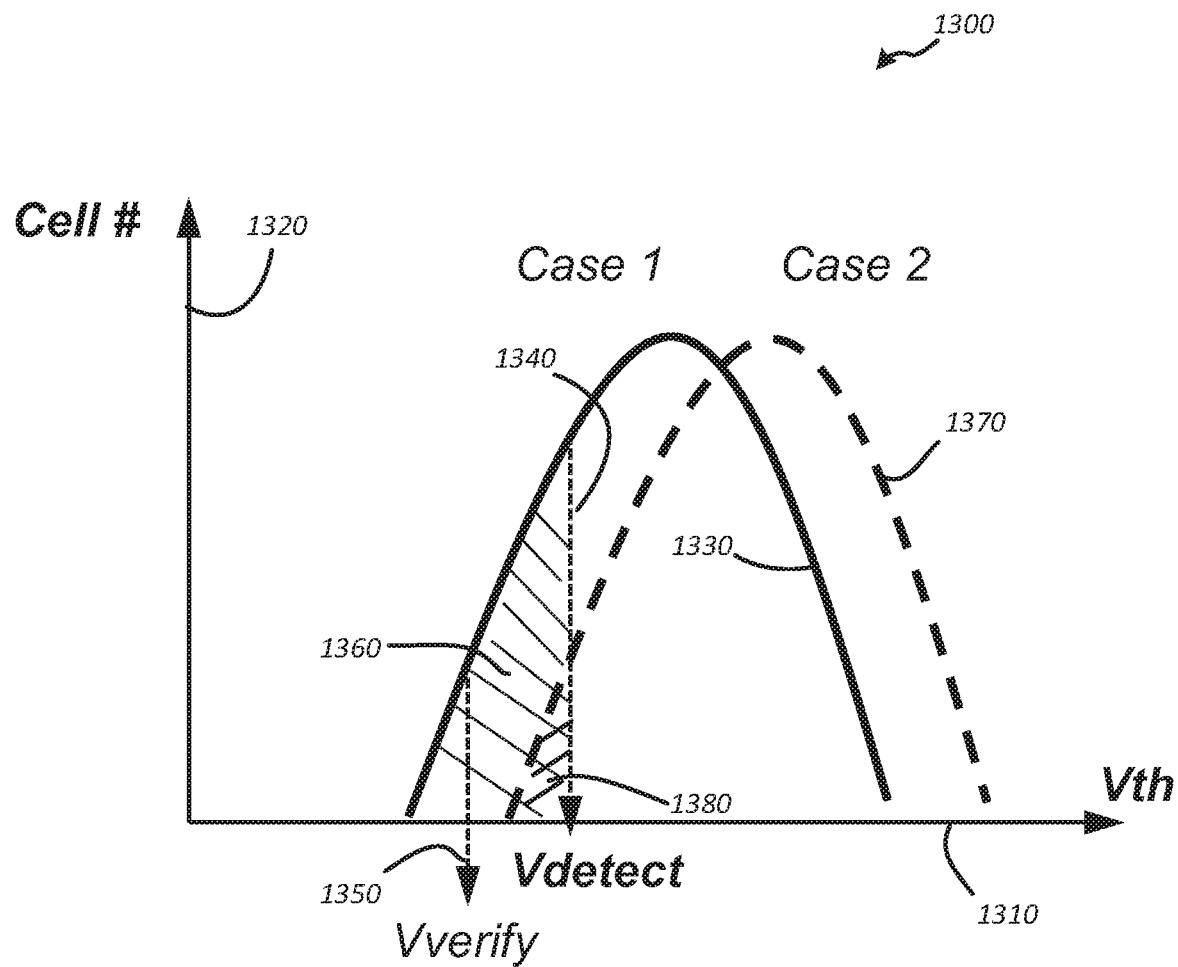
FIG. 13 is a graph that depicts the operation of the determination circuit, according to one embodiment.

FIG. 13 is a graph 1300 that depicts the operation of the determination circuit 1170, according to one embodiment. The determination circuit 1170 conducts a program verify operation in which a plurality of programmed cells of the memory array 200 are sensed at a detection voltage "Vdetect," which need not be the same as a verification voltage "Vverify" used to conduct program verify operations to confirm that programmed cells have reached the threshold voltage. The determination circuit 1170 determines whether the threshold voltage has shifted by sensing the number of cells—below the detection voltage—.

Specifically, as shown, the graph 1300 has a horizontal axis 1310 showing the threshold voltage Vth, and a vertical axis 1320 showing the number of cells sensed at that threshold voltage. In a first case, represented by a curve 1330, the average threshold voltage of the non-volatile memory elements 123 is at a nominal level, with threshold voltages forming a generally bell-shaped curve centered at the average threshold voltage. The first case may represent a test of the memory array 200 at the factory, or early in its operating life after each memory cell has received a single programming pulse, before the threshold voltage has shifted significantly due to degradation from programing. In the alternative, the first case may represent a test of the memory array 200 after significant program/erase cycles have already been performed and/or one or more revisions of one or more programming settings have already been performed.

The determination circuit 1170 may apply a detection voltage 1340, labeled "Vdetect," across the non-volatile memory elements 123 in a given word line, block, or memory array. The detection voltage 1340 may be greater than a verification voltage 1350, labeled "Vverify," that is used for program verify operations. At the detection voltage 1340, a quantity 1360, represented by the area under the curve 1330 to the left of the detection voltage 1340, may conduct current. The number of bits sensed at the detection voltage 1340 may be termed "N." N may be the number of bits sensed prior to the occurrence of significant program/erase cycles, or may be the number of bits read in a previous test, for example, last time one or more programming settings were revised.

In a second case, represented by a curve 1370, the average threshold voltage of the non-volatile memory elements 123 has shifted upward, for example, due to degradation of the insulative elements of some of the non-volatile memory elements 123. Thus, the curve 1370 may be shifted to the right relative to the curve 1330, indicating that the distribution of threshold voltages across the non-volatile storage elements 123 has increased. The second case may represent a test of the memory array 200 after a significant number of program/erase cycles.

The determination circuit 1170 again applies the detection voltage 1340 to sense non-volatile memory elements 123 that have been programmed previously. At the detection voltage 1340, a quantity 1380, represented by the area under the curve 1370 to the left of the detection voltage 1340, may be read as having been programmed. Due to the rightward shift of the curve 1370, relative to the curve 1330, the number of bits read at the detection voltage 1340 (quantity 1380) may be less than N (quantity 1360). This change in bits read at the detection voltage 1340 may be indicative of the presence and/or extent of the increase in threshold voltage, providing a rightward shift in the curve 1370, indicative of overprogramming.

The determination circuit 1170 may use any of a variety of criteria to determine whether the shift in threshold voltage necessitates revision of one or more programming settings. In some embodiments, if the number of bits sensed at the detection voltage 1340 is lower than N, it may determine that a change in one or more programming settings is warranted. In other embodiments, the number of bits read at the detection voltage 1340 may need to be lower than N by a predetermined quantity or percentage before adjustment of one or more programming settings is deemed warranted.

The graph 1300 of FIG. 13 is merely exemplary. Changes in the threshold voltage may be detected and/or measured in a wide variety of other ways. In some examples, the detection voltage 1340 may be greater than illustrated in FIG. 13, and may even be greater than the average threshold voltage for the non-volatile memory elements 123. Additionally, or alternatively, rather than measuring the bits "sensed" at the detection voltage 1340, the bits that are not read (i.e., the area to the right of the detection voltage 1340 and underneath the curve 1330 or the curve 1370 may be measured. In such a case, an increase in the number of cells not sensed may indicate an increased threshold voltage, and may be used to determine that a change in one or more programming settings is warranted.

In some embodiments, the determination circuit 1170 does not sense the contents of any of the non-volatile memory elements 123 in order to make the determination. Rather, the determination circuit 1170 may make the determination in other ways. For example, if a read error is reported, the determination circuit 1170 may adjust the programming settings in response to the read error. Alternatively, the storage circuit 1160 may record a number of programming/erase cycles (for example, on the memory array 200), and the determination circuit 1170 may function based on the cycle count. For example, when the cycle count reaches any of a predetermined number of levels, the determination circuit 1170 determines that the programming voltage is to be reduced. In some embodiments, the cycle count is used to adjust programming settings as set forth in U.S. Pat. No. 9,548,124, which is incorporated by reference herein.

The update circuit 1180 may change the programming settings in a variety of ways. As mentioned previously, the update circuit 1180 may store the programming setting(s) on the memory array 200, for example, on a portion of the memory array 200 that will not be erased. Accordingly, the programming setting(s) may have unique architecture and/or storage methods. One example will be shown and described in connection with FIG. 14.

Figure 14:
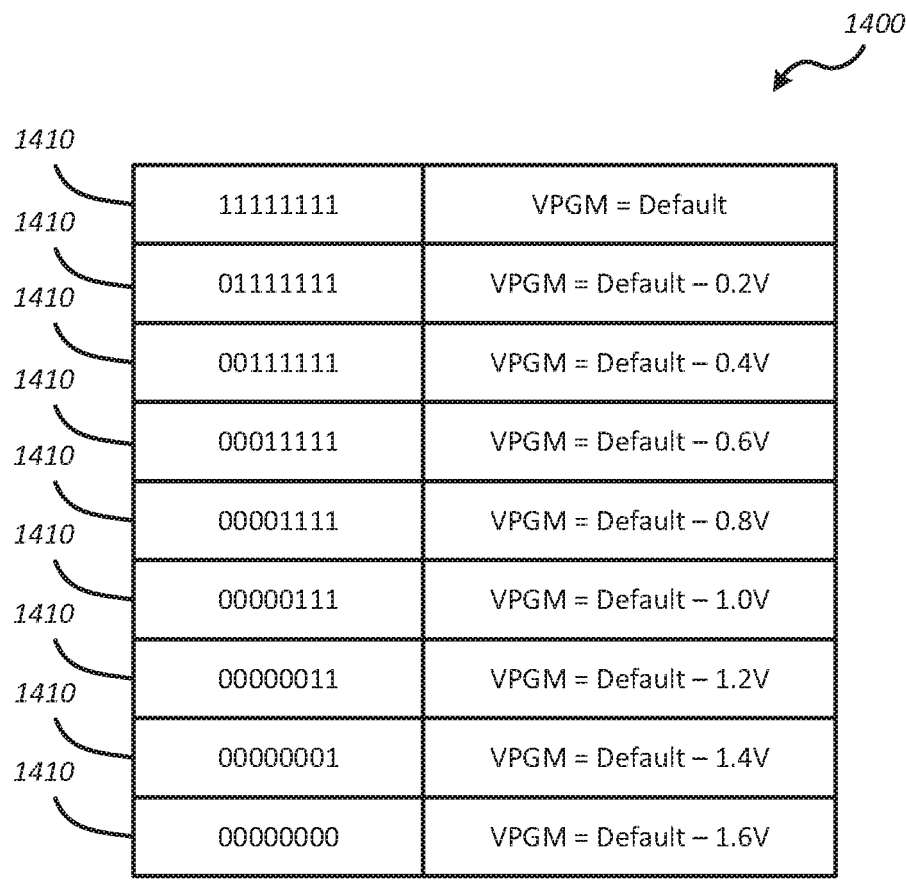
FIG. 14 depicts a byte that may be used to store a programming setting, according to one embodiment.

FIG. 14 depicts a lookup table 1400 that may be used to store a programming setting within a single byte, according to one embodiment. The byte may reside on the memory array 200, for example, in the subset 209 of the block 202. The byte may optionally be programmable, but not erased with the block erase commands used to erase the block (for example, the block 202 of FIG. 2A) to which the byte pertains. Thus, the byte may be retained while erase operations erase the user data on the other word lines (for example, the word lines WL0 through WL16 of the block 202). The lookup table 1400 may have nine rows, each of which may provide the programming voltage that corresponds to a given state of the byte.

The byte may be used to store a programming setting that does not directly encode the programming setting, but rather serves as an indicator that can be used to ascertain the programming setting. For example, the byte may store a programming setting in the form of a programming voltage flag 1410, which may be used to indicate a programming voltage to be applied to future programming operations through the use of the lookup table 1400. In a default state, the byte may be set in a state in which all bits are set to an unprogrammed, or erased, state. In the case of an SLC NAND array, this may entail setting all eight bits of the byte to "1," as in the first of the programming voltage flags 1410 in the lookup table 1400. In other types of memory arrays, this may entail setting all of the bits to "0," as different memory arrays may utilize different interpretations of whether a programmed bit is a "0" or a "1."

In FIG. 14, the initial unprogrammed state of the byte is assumed to be "11111111," as shown in the first row of the table. This may be the default state of the byte, and may be the state in which the byte resides when shipped from the factory. Where the programming settings include a programming voltage flag 1410 that is to be stored in the byte, the unprogrammed state of the byte may be a programming voltage flag 1410 representing a default programming voltage. The initial programming operations performed on the memory array 200 may be done at the default programming voltage.

When the evaluation circuit 1190 makes a determination to assess the programming setting(s), the determination circuit 1170 may operate as described previously to determine whether to update the programming setting(s). If an update is warranted, one of the bits of the byte may be programmed, for example, by the update circuit 1180.

In some embodiments, where the programming voltage is being assessed for the purpose of controlling the increase in threshold voltage that may occur due to breakdown of the oxide layer(s) on the non-volatile memory elements 123, changing the programming voltage may entail progressively reducing the programming voltage. Where the programming voltage need only be changed in one direction (i.e., downward), changing the programming setting may entail revising the programming voltage flag 1410 to represent a new, lower programming voltage, thereby storing a revised programing setting in the form of a revised programming voltage flag 1410. A programming setting may be stored, for example, in the registry of the die controller 220, and used for all programming operations until an update occurs. A "revised programming setting" is a programming setting that has been modified in some way. The modification of the programming setting may entail overwriting, erasing and rewriting, or otherwise altering the programming setting to store the revised programming setting. Similarly, a "revised programming voltage flag" is a programming voltage flag that has been modified in some way.

Thus, with reference to the example of FIG. 14, the first time the determination circuit 1170 determines that the programming voltage is to be changed, the update circuit 1180 may update the byte by changing, for example, only the first bit of the byte to a programmed state, or a "0." The remaining bits may remain unchanged. The changing/programming of only one bit to change the byte (e.g. programming voltage flag) reduces the overhead incident to updating/storing the programming setting. Thus, the update may occur very quickly, leaving the processing and I/O capacity of the die controller 220 available for other tasks.

After the update circuit 1180 has performed the update, the byte may have a value of "01111111," which may be a programming voltage flag 1410 that represents a programming voltage equivalent to the default programming voltage with a decrement, such as 0.2 Volts, as shown in the second row of the lookup table 1400.

Similarly, the second time the determination circuit 1170 determines that the programming voltage is to be reduced, the update circuit 1180 may program the second bit may be programmed to a programmed state, or a "0." The remaining bits may remain unchanged. Thus, the byte may have a value of "00111111," which may be a programming voltage flag 1410 that represents a programming voltage equivalent to the default programming voltage, with two times the decrement, or the default programming voltage minus 0.4 Volts.

The same pattern may hold true for the remaining programming voltage adjustments to be made. For each adjustment, the update circuit 1180 may change one of the bits of the byte to a programmed state, without changing any of the other bits. The bits may not be erased, so once each of the bits is programmed, it may remain so for the life of the memory array 200. With each change, the byte contains a new programming voltage flag 1410 representing a lower programming voltage. Thus, the programming voltage may gradually be reduced, in steps, through the life of the memory array 200. Such a programming voltage reduction may help to keep the threshold voltage of the non-volatile memory elements 123 within a predetermined and/or predefined range (such as a distribution matching that of the first case, shown by the curve 1330 of FIG. 13, rather than the upwardly-shifted distribution of the second case, shown by the curve 1370).

In various embodiments, one or more programming settings may be adjusted for various purposes besides the need to compensate for insulative element degradation. For example, programming voltage may be adjusted to accommodate manufacturing variation inherent in the processes used to manufacture the memory arrays 200.

For example, the default programming voltage applied to the memory array 200 in the factory may not fully account for such variation. Thus, the initial programming voltage may be too high or too low. The phrase "suboptimal programming" refers to a programming setting or procedure that causes cell programming to occur in a manner that is not ideal. For example, a programming voltage that is too high or too low is suboptimal because it may cause the threshold voltage of programmed cells to be too high or too low, respectively. Optimization of programming voltages is described in greater detail in U.S. application Ser. No. 10/818,597, filed Apr. 6, 2004 and entitled VARIABLE PROGRAMMING OF NON-VOLATILE MEMORY, now issued as U.S. Pat. No. 7,020,017, referenced previously.

In order to provide greater flexibility in optimization of a programming setting, it may be desirable to permit the setting to be adjusted upward or downward. Such flexibility may be obtained by allotting additional bits to the storage of a programming setting, or by revising the way in which bits are used to store such a programming setting.

More particularly, in the example of FIG. 14, the first row of the lookup table 1400 may be used to specify whether the programming voltage flag 1410 encoded in the remaining rows indicates increasing or decreasing voltage. For example, if the first row of the lookup table 1400 remains set to an unprogrammed state, the byte may be read to contain a voltage decrement as outlined above, except the first row may then excluded from the decrement. Thus, if the byte reads "00111111," this programming voltage flag may 1410 correspond to a programming voltage equal to the default programming voltage, minus 0.2 Volts. However, if the first row is programmed, the byte may be read to contain a voltage increment, excluding the first row. Thus, if the byte reads "10111111," this voltage flag may correspond to a programming voltage equal to the default programming voltage, plus 0.2 Volts.

Such a storage scheme permits the programming voltage to be gradually increased or decreased, but does not permit the programming voltage to be increased and then decreased, or decreased and then increased. Those of skill in the art will recognize that a wide variety of storage schemes may be used to encode revised programming voltage flags representing positive or negative programming voltage adjustments.

The setting adjustment component 150 and/or the die controller 220 may operate to program cells and adjust one or more programming settings according to a wide variety of methods. One exemplary embodiment will be shown and described in connection with FIG. 9.

Figure 15:
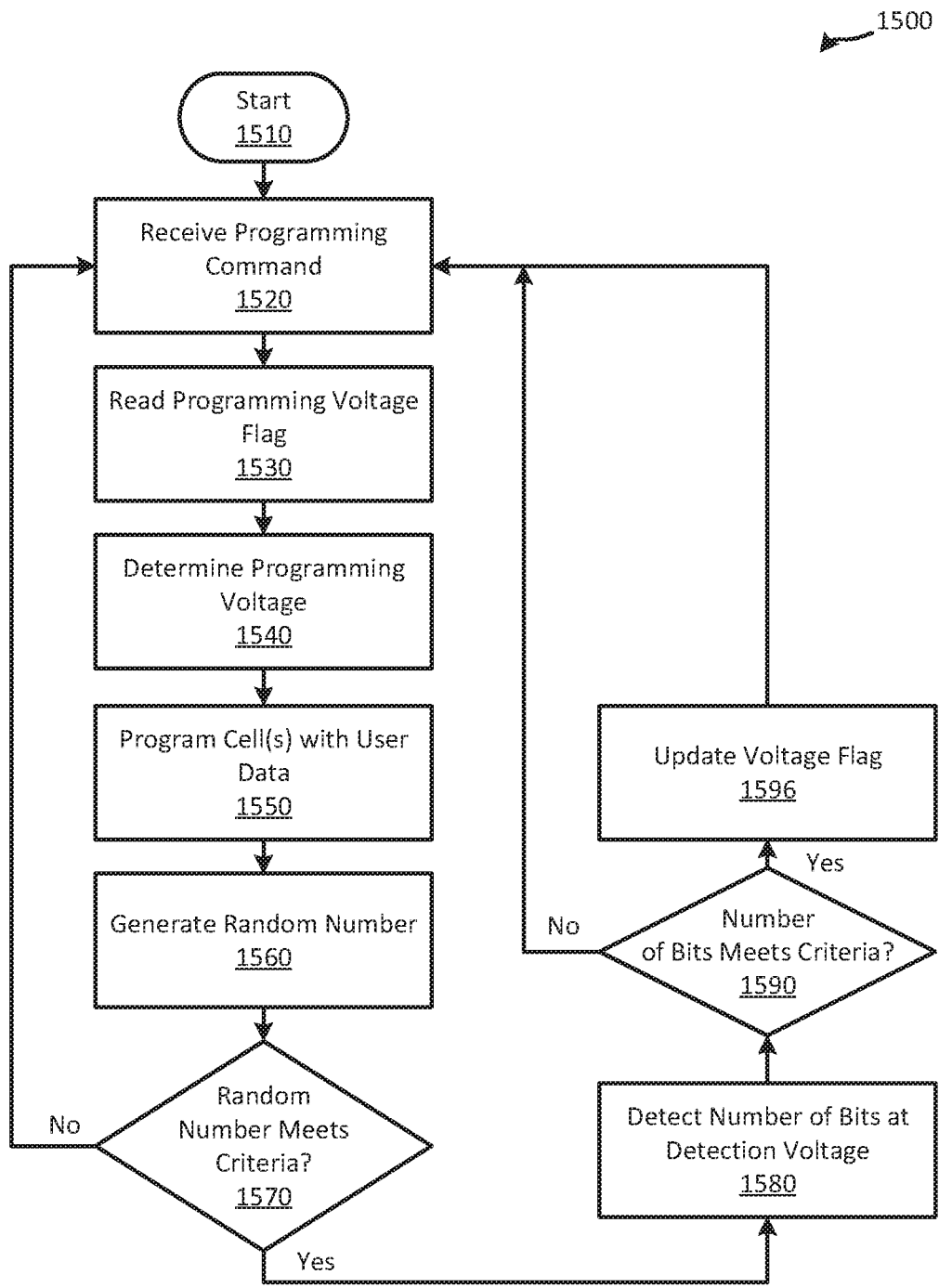
FIG. 15 depicts one embodiment of a method for programming cells of a memory array, with periodic adjustments to programming voltage.

FIG. 15 depicts one embodiment of a method 1500 for programming cells of a memory array, with periodic adjustments to programming voltage. The method 1500 may be performed each time one or more of the non-volatile memory elements 123 is to be programmed. The method 1500 may be performed by the die controller 220, for example, through the use of the various circuits set forth in FIG. 11. In the alternative, the method 1500 may be performed with different hardware, such as the controller 244 of FIG. 1B and/or the non-volatile memory media controller 126 of FIG. 1A.

As shown, the method 1500 may start 1510 with a step 1520 in which a command is received to program one or more of the non-volatile memory elements 123 of the memory array 200. The command may be received, for example, in the die controller 220. Such a command may be received in the storage circuit 1160 of the die controller 220.

In a step 1530, one or more programming settings may be determined. This may include reading a programming voltage and/or a programming voltage flag from the memory array 200. For example, the step 1530 may include reading the programming voltage flag 1410 (which may be a revised or updated programming voltage flag) stored in the byte referenced in the discussion of FIG. 14. The step 1530 may be performed, for example, by the storage circuit 1160 of the die controller 220.

In a step 1540, the appropriate programming voltage may be determined. The programming voltage flag 1410 retrieved in the step 1530 may be used to accomplish this. For example, the step 1530 may include using the programming voltage flag 1410 to determine the applicable programming voltage by looking up the programming voltage flag 1410 in a lookup table that matches each programming voltage flag 1410 to the associated programming voltage level. Such a lookup table may resemble the lookup table 1400 of FIG. 14. Like the step 1530, the step 1540 may be performed, for example, by the storage circuit 1160 of the die controller 220.

In a step 1550, one or more of the non-volatile memory elements 123 may be programmed using the programming setting(s) determined in the step 1540. This may be carried out by the storage circuit 1160 of the die controller 220.

In a step 1560, a random number may be generated. This may be done, for example, by the random number generator 1150 of the die controller 220. The random number may be used to evaluate whether, as part of the current programming cycle, a determination is to be made regarding whether to change the programming voltage for future programming steps.

In some embodiments, the step 1560 is initiated prior to completion of the step 1550. For example, in some embodiments, the step 1560 is initiated prior to or simultaneously with initiation of the step 1520, the step 1530, the step 1540, and/or the step 1550. The step 1560 may last for part or all of the duration of any one or more of the step 1520, the step 1530, the step 1540, and the step 1550. Thus, in some embodiments, the step 1560 is already complete, and the random number is available at the time the step 1550 is completed.

Pursuant to a query 1570, a determination may be made regarding whether the random number meets one or more criteria. As set forth above, in order to reduce the time required for programming, the programming settings may only be evaluated periodically. One (and possibly the only) criterion may be whether the random number falls within a particular range. In some embodiments, this may entail determining that the random number is a specific value— thus, the applicable range may include only one value.

If the random number does not meet the one or more criteria, the programming step may be complete. The method 1500 may be repeated when a command is again received to program one or more of the non-volatile memory elements 123 of the memory array 200.

If the random number meets the one or more criteria, the method 1500 may proceed to a step 1580 in which a number of the non-volatile memory elements 123 may be sensed at a detection voltage such as the detection voltage 1340 of FIG. 7. This may be done by the determination circuit 1170 of the die controller 220, as described in connection with FIG. 7.

Pursuant to a query 1590, a determination may be made as to whether the number of bits sensed in the step 1580 meets one or more criteria. This determination may be made, for example, by the determination circuit 1170 of the die controller 220. As set forth previously, one (and possibly the only) criteria for the query 990 may be whether the number of bits sensed is greater than a predefined level, or "N," as set forth above.

If the number of bits read does not satisfy the one or more criteria, the determination circuit 1170 of the die controller 220 may determine that no programming settings need to be updated. The programming step may be complete. The method 1500 may be repeated when a command is again received to program one or more of the non-volatile memory elements 123 of the memory array 200.

If the number of bits read satisfies the one or more criteria, the determination circuit 570 of the die controller 220 may determine that one or more of the programming settings need to be updated. Thus, the method 1500 may proceed to a step 1596 in which the one or more programming settings are updated. This may be done, for example, by updating a voltage flag 1410 as described in connection with FIG. 14. The step 1596 may be carried out by the update circuit 1180 of the die controller 220.

After the programming voltage flag 1410 has been updated, the programming step may be complete. The method 1500 may be repeated when a command is again received to program one or more of the non-volatile memory elements 123 of the memory array 200.

A means for reading a programming setting on a spare column of a first word line of a plurality of word lines of a set of non-volatile storage cells, in various embodiments, may include a setting adjustment component 150, a die controller 220, a storage circuit 1160, a non-volatile memory device interface 139, a non-volatile memory media controller 126, a storage client 116, a database system 116*a*, a host computing device 110, a bus 127, a communications network 115, a device driver, a controller (e.g., a device driver, or the like) executing on a host computing device 110, a processor 111, other logic hardware, and/or other executable code stored on a computer readable storage medium. Other embodiments may include similar or equivalent means for reading a programming setting on a spare column of a first word line of a plurality of word lines of a set of non-volatile storage cells.

A means for writing data to one or more of the plurality of word lines using the programming setting, in various embodiments, may include a setting adjustment component 150, a die controller 220, a storage circuit 1160, a non-volatile memory device interface 139, a non-volatile memory media controller 126, a storage client 116, a database system 116*a*, a host computing device 110, a bus 127, a communications network 115, a device driver, a controller (e.g., a device driver, or the like) executing on a host computing device 110, a processor 111, other logic hardware, and/or other executable code stored on a computer readable storage medium. Other embodiments may include similar or equivalent means for writing data to one or more of the plurality of word lines using the programming setting.

A means for determining that the programming setting causes a threshold voltage of one or more of the non-volatile storage cells to be excessive, in various embodiments, may include a setting adjustment component 150, a die controller 220, a determination circuit 1170, a non-volatile memory device interface 139, a non-volatile memory media controller 126, a storage client 116, a database system 116*a*, a host computing device 110, a bus 127, a communications network 115, a device driver, a controller (e.g., a device driver, or the like) executing on a host computing device 110, a processor 111, other logic hardware, and/or other executable code stored on a computer readable storage medium. Other embodiments may include similar or equivalent means for determining that the programming setting causes a threshold voltage of one or more of the non-volatile storage cells to be excessive.

A means for storing a revised programming setting on the spare column of the first word line in response to determining that the programming setting causes the threshold voltage to be excessive, in various embodiments, may include a setting adjustment component 150, a die controller 220, an update circuit 1180, a non-volatile memory device interface 139, a non-volatile memory media controller 126, a storage client 116, a database system 116*a*, a host computing device 110, a bus 127, a communications network 115, a device driver, a controller (e.g., a device driver, or the like) executing on a host computing device 110, a processor 111, other logic hardware, and/or other executable code stored on a computer readable storage medium. Other embodiments may include similar or equivalent means for storing a revised programming setting on the spare column of the first word line in response to determining that the programming setting causes the threshold voltage to be excessive.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A memory die comprising:
a set of non-volatile storage cells arranged into a plurality of rows, wherein a subset of the set of non-volatile storage cells is configured to store a programming setting; and
an on-die controller configured to:
read the programming setting from the subset of the set of non-volatile storage cells;
write data to the set of non-volatile storage cells using the programming setting;
determine that the programming setting causes suboptimal programming of the data to the set of non-volatile storage cells; and
in response to determining that the programming setting causes the suboptimal programming of the data to the set of non-volatile storage cells, store a revised programming setting in the subset of the set of non-volatile storage cells.

2. The memory die of claim 1, wherein:
the programming setting indicates a first programming voltage;
the on-die controller is further configured to write the data to the set of non-volatile storage cells by transmitting a single pulse at the first programming voltage to non-voltage storage cells of the set of non-volatile storage cells; and
the revised programming setting indicates a second programming voltage lower than the first programming voltage.

3. The memory die of claim 1, wherein the on-die controller is further configured to store the revised programming setting in the subset of the set of non-volatile storage cells without first erasing the programming setting from the subset of the set of non-volatile storage cells.

4. The memory die of claim 1, wherein each of the plurality of rows is associated with one of a plurality of word lines, and wherein the plurality of word lines comprises:
a dummy word line in a dummy row comprising two or more spare columns comprising the subset of the set of non-volatile storage cells; and
a plurality of data word lines in a plurality of data rows, separate from the dummy word line, the plurality of data word lines configured to store the data.

5. The memory die of claim 4, wherein the subset of the set of non-volatile storage cells is positioned proximate a driver of the dummy word line.

6. The memory die of claim 1, wherein the on-die controller is further configured to:
determine a number of the set of non-volatile storage cells with a threshold voltage within a predetermined range; and
determine whether the number of the set of non-volatile storage cells with the threshold voltage within the predetermined range satisfies one or more criteria.

7. The memory die of claim 1, wherein the on-die controller is further configured to determine that the programming setting causes the suboptimal programming of the data to the set of non-volatile storage cells in response to a trigger that is configured to activate after a random number of programming operations are performed on one or more of the plurality of rows.

8. An apparatus comprising:
a set of non-volatile storage cells connected to word lines and bit lines, the word lines comprising:
  a dummy word line configured to store a programming voltage flag; and
  a plurality of data word lines;
an on-die controller comprising:
  a storage circuit configured to:
    use a first programming voltage associated with the programming voltage flag to store user data in non-volatile storage cells associated with the plurality of data word lines;
  a determination circuit configured to determine that the first programming voltage causes over-programming of the non-volatile storage cells associated with the plurality of data word lines;
  a setting selection circuit configured to, in response to determining by the determination circuit that the first programming voltage causes the over-programming of the non-volatile storage cells associated with the plurality of data word lines, select a second programming voltage different from the first programming voltage; and
  an update circuit configured to store a revised programming voltage flag associated with the second programming voltage in a non-volatile storage cell associated with the dummy word line by overwriting at least part of the programming voltage flag with the revised programming voltage flag.

9. The apparatus of claim 8, wherein:
the storage circuit is further configured to store the user data by transmitting a single pulse at the first programming voltage to the non-volatile storage cells associated with the plurality of data word lines; and
the second programming voltage is lower than the first programming voltage.

10. The apparatus of claim 9, wherein the determination circuit is further configured to determine that the first programming voltage causes the over-programming of the non-volatile storage cells associated with the plurality of data word lines by determining that the single pulse causes the over-programming of one or more of the non-volatile storage cells associated with the plurality of data word lines.

11. The apparatus of claim 10, wherein:
the on-die controller further comprises:
  a random number generator configured to generate a random number; and
  an evaluation circuit configured to determine that the random number meets one or more criteria; and
the determination circuit is further configured to determine that the single pulse causes the over-programming of the one or more of the non-volatile storage cells associated with the plurality of data word lines in response to determining, by the evaluation circuit, that the random number meets the one or more criteria.

12. The apparatus of claim 8, wherein the dummy word line is further configured to store the programming voltage flag in a spare column associated with the dummy word line, proximate to a decoder associated with the dummy word line.

13. The apparatus of claim 8, wherein:
a dummy row associated with the dummy word line stores a byte of the programming voltage flag with one or more bits set to an erased state; and the storage circuit is further configured to store the revised programming voltage flag by changing the one or more bits to a programmed state without changing any bit of the byte to an erased state.

14. A system comprising:
an SLC NAND array comprising a set of non-volatile storage cells; and
an on-die controller that shares a die with the SLC NAND array, wherein the on-die controller is configured to:
  read a programming voltage setting from the SLC NAND array;
  initiate a single pulse to write data on the SLC NAND array at the programming voltage setting;
  determine that the writing of the data at the programming voltage setting causes suboptimal programming of one or more of the set of non-voltage storage cells; and
  initiate storage of an updated programming voltage setting in response to determining that the writing of the data at the programming voltage setting causes the suboptimal programming of the one or more of the set of non-volatile storage cells.

15. The system of claim 14, wherein the suboptimal programming comprises over-programming of the one or more of the set of non-volatile storage cells.

16. The system of claim 14, wherein the on-die controller is further configured to store the updated programming voltage setting without erasing the programming voltage setting from the SLC NAND array.

17. A method comprising:
reading a programming setting from a setting segment of non-volatile storage cells;
writing data on a data segment of non-volatile storage cells using the programming setting;
in response to a trigger, determining that the programming setting causes suboptimal programming on the data segment; and
storing a revised programming setting on the setting segment in response to determining that the programming setting causes the suboptimal programming on the data segment.

18. The method of claim 17, wherein:
the programming setting indicates a first programming voltage;
writing the data on the data segment comprises transmitting a single pulse at the programming voltage through the data segment; and
storing the revised programming setting comprises storing indication of a second programming voltage, lower than the first programming voltage, on the setting segment.

19. The method of claim 17, wherein storing the revised programming setting comprises over-writing at least part of the programming setting to store the revised programming setting.

20. The method of claim 17, further comprising providing the trigger by determining that the programming setting causes a threshold voltage of one or more of the non-volatile storage cells to exceed a predefined level.

21. The method of claim 20, wherein determining that the programming setting causes the threshold voltage to exceed the predefined level comprises:
determining a number of cells with a threshold voltage within a predetermined range; and
determining whether the number of cells with the threshold voltage within the predetermined range satisfies one or more criteria.

22. The method of claim 17, further comprising providing the trigger by:
- generating a random number; and
- detecting the trigger by determining that the random number meets one or more criteria.

23. An apparatus comprising:
- means for reading a programming setting on a spare column associated with a first word line of a plurality of word lines, wherein the plurality of word lines are connected to a set of non-volatile storage cells;
- means for writing data to one or more of the set of non-volatile storage cells of the plurality of word lines using the programming setting;
- means for determining that the programming setting causes a threshold voltage of the one or more of the set of non-volatile storage cells to be excessive; and
- means for storing a revised programming setting on the spare column associated with the first word line in response to determining that the programming setting causes the threshold voltage to be excessive.

* * * * *